US008426926B2

(12) United States Patent
Shin et al.

(10) Patent No.: US 8,426,926 B2
(45) Date of Patent: Apr. 23, 2013

(54) SEMICONDUCTOR DEVICES HAVING FIELD EFFECT TRANSISTORS WITH EPITAXIAL PATTERNS IN RECESSED REGIONS

(75) Inventors: Dongsuk Shin, Yongin-si (KR); Dong Hyuk Kim, Seongnam-si (KR); Myungsun Kim, Hwaseong-si (KR); YongJoo Lee, Hwaseong-si (KR); Hoi Sung Chung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 14 days.

(21) Appl. No.: 13/078,159

(22) Filed: Apr. 1, 2011

(65) Prior Publication Data
US 2011/0241071 A1 Oct. 6, 2011

(30) Foreign Application Priority Data

Apr. 6, 2010 (KR) .................. 10-2010-0031476

(51) Int. Cl.
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |
| H01L 29/00 | (2006.01) |

(52) U.S. Cl.
USPC ........... 257/401; 257/396; 257/397; 257/501; 257/506; 257/510; 257/E57.026; 257/E27.027; 257/E29.005; 257/E29.02; 257/E29.024

(58) Field of Classification Search .................. 257/396, 257/397, 501, 506, 510, E29.02, 401, E27.026, 257/E27.027, E29.005, E29.024
See application file for complete search history.

(56) References Cited

U.S. PATENT DOCUMENTS

| 5,494,837 | A * | 2/1996 | Subramanian et al. ....... 438/149 |
| 7,312,110 | B2 * | 12/2007 | Kwak et al. .................... 438/150 |
| 7,358,551 | B2 | 4/2008 | Chidambarrao et al. |
| 7,429,504 | B2 * | 9/2008 | Kim et al. ..................... 438/191 |
| 7,494,884 | B2 | 2/2009 | Lin et al. |
| 7,541,645 | B2 * | 6/2009 | Kim et al. ..................... 257/347 |
| 7,575,964 | B2 * | 8/2009 | Oh et al. ....................... 438/149 |
| 7,670,912 | B2 * | 3/2010 | Yeo et al. ..................... 438/283 |
| 7,728,393 | B2 * | 6/2010 | Rhee et al. .................... 257/408 |
| 7,759,199 | B2 * | 7/2010 | Thomas et al. ............... 438/269 |
| 7,768,070 | B2 * | 8/2010 | Yun et al. ...................... 257/347 |
| 7,851,327 | B2 * | 12/2010 | Son et al. ...................... 438/430 |
| 7,923,753 | B2 * | 4/2011 | Mita et al. ..................... 257/192 |
| 7,968,910 | B2 * | 6/2011 | Chen et al. .................... 257/190 |

(Continued)

Primary Examiner — Ida M Soward
(74) Attorney, Agent, or Firm — Myers Bigel Sibley & Sajovec

(57) ABSTRACT

A semiconductor device includes a device isolation pattern, a gate line, and an epitaxial pattern. The device isolation pattern is disposed in a semiconductor substrate to define an active area. The gate line intersects the active area. The epitaxial pattern fills a recess region in the active area at one side of the gate line and includes a different constituent semiconductor element than the semiconductor substrate. The recess region includes a first inner sidewall that is adjacent to the device isolation pattern and extends in the lengthwise direction of the gate, and a second inner sidewall that extends in the direction perpendicular to the lengthwise direction of the gate line. The active area forms the first inner sidewall of the recess, while the device isolation layer forms at least a portion of the second inner sidewall of the recess. The epitaxial pattern contacts the first inner sidewall and the second inner sidewall of the recess region.

19 Claims, 23 Drawing Sheets

U.S. PATENT DOCUMENTS

| | | |
|---|---|---|
| 8,278,176 B2 * | 10/2012 | Bauer et al. .................. 438/300 |
| 2004/0217434 A1 * | 11/2004 | Lee et al. ..................... 257/412 |
| 2007/0057324 A1 * | 3/2007 | Tews et al. ................... 257/347 |
| 2008/0157200 A1 | 7/2008 | Kim et al. |
| 2009/0101942 A1 | 4/2009 | Dyer |
| 2009/0159983 A1 * | 6/2009 | Welsh et al. ................. 257/378 |
| 2009/0166755 A1 | 7/2009 | Chakravarthi et al. |
| 2009/0184341 A1 | 7/2009 | Chong et al. |
| 2010/0078698 A1 * | 4/2010 | Son et al. ..................... 257/296 |
| 2011/0042753 A1 * | 2/2011 | Jain et al. ..................... 257/369 |
| 2012/0244688 A1 * | 9/2012 | Bauer et al. .................. 438/507 |

* cited by examiner

SEMICONDUCTOR DEVICES HAVING FIELD EFFECT TRANSISTORS WITH EPITAXIAL PATTERNS IN RECESSED REGIONS

CROSS-REFERENCE TO RELATED APPLICATION

This U.S. non-provisional patent application claims priority under 35 U.S.C. §119 of Korean Patent Application No. 10-2010-0031476, filed on Apr. 6, 2010, the entire contents of which are hereby incorporated by reference herein.

BACKGROUND

The present disclosure herein relates to a semiconductor devices and, more particularly, to semiconductor devices that include field effect transistors and to methods for fabricating such devices.

Due to the advantages of their light weight, small size and/or low cost, semiconductor devices are widely used in numerous applications such as electronic devices, automobiles and/or ships. Field effect transistors (hereinafter also referred to as "transistors") are one of the important constituent elements of many semiconductor devices. Typically, a transistor may include a source region (or "source") and a drain region (or "drain") which are spaced apart from each other in a semiconductor substrate, and a gate electrode that covers a channel region that is disposed between the source and the drain. The source and the drain may be formed by implanting dopant ions into the semiconductor substrate. The semiconductor substrate may be a bulk semiconductor substrate, a semiconductor on insulator substrate, a semiconductor epitaxial layer on a semiconductor or non-semiconductor substrate, etc. The gate electrode may be insulated from the channel region by a gate oxide layer disposed between the semiconductor substrate and the gate electrode. Such a transistor is widely used as a switching element and/or a logic circuit in a semiconductor device.

There is a constant demand for smaller and faster semiconductor devices. However, as size of a transistor is reduced, it can cause a decrease in the turn-on current for the transistor, which in turn may cause a decrease in the operation speed of the transistor. A decrease in the operation speed of the transistor may cause a decrease in the reliability of the semiconductor device and a decrease in the operation speed of the semiconductor device. Thus, research is being conducted on schemes for increasing the turn-on current for transistors that are used in highly-integrated semiconductor devices.

SUMMARY

The present disclosure provides a semiconductor device, which may have high integration and high reliability, and a method for fabricating the same.

The present disclosure also provides a semiconductor device, which can increase the turn-on current of a field effect transistor, and a method for fabricating the same.

The present disclosure also provides a semiconductor device, which can increase the mobility of carriers in the channel of a field effect transistor, and a method for fabricating the same.

In some embodiments of the inventive concept, semiconductor devices are provided that include a device isolation pattern that is disposed in a semiconductor substrate to define an active area; a gate line intersecting the active area; and an epitaxial pattern in a recess region in the active area at one side of the gate line, the epitaxial pattern including a different constituent semiconductor element than the semiconductor substrate. In these devices, the recess region includes a first inner sidewall that extends in the lengthwise direction of the gate line, and a second inner sidewall that extends in the direction perpendicular to the lengthwise direction of the gate line. The active area comprises the first inner sidewall and the device isolation pattern comprises at least a portion of the second inner sidewall. Additionally, the epitaxial pattern directly contacts the first inner sidewall and the second inner sidewall of the recess region.

In some embodiments, the device isolation pattern forms the entire second inner sidewall.

In other embodiments, the semiconductor devices further include a hard mask pattern disposed on the device isolation pattern, where the hard mask pattern covers the active area between the first inner sidewall of the recess region and the device isolation pattern adjacent to the first inner sidewall.

In further embodiments, the second inner sidewall includes a first portion that is formed of the active area and a second portion that is formed of the device isolation pattern, wherein the second portion of the second inner sidewall is closer to the gate line than the first portion of the second inner sidewall.

In still further embodiments, in the direction perpendicular to the lengthwise direction of the gate line, the length of the first portion of the second inner sidewall is greater than the length of the second portion of the second inner sidewall.

In still further embodiments, the semiconductor device further includes a hard mask pattern on the device isolation pattern, where the hard mask pattern covers the active area between the first inner sidewall and the device isolation pattern adjacent to the first inner sidewall, and where the hard mask pattern further covers the active area between the first portion of the second inner sidewall and the device isolation pattern adjacent to the first portion of the second inner sidewall.

In still further embodiments, the epitaxial pattern provides a compressive force to the active area under the gate line.

In still further embodiments, the epitaxial pattern provides a tensile force to the active area under the gate line.

In still further embodiments, the semiconductor devices further include a capping semiconductor pattern disposed on the epitaxial pattern.

In still further embodiments, the active area under the gate line is doped with a first-type dopant and the epitaxial pattern is doped with a second-type dopant.

In other embodiments of the inventive concept, methods for fabricating a semiconductor device are provided that include: forming a device isolation pattern in a semiconductor substrate to define an active area that includes a first sidewall extending in a first direction and a second sidewall extending in a second direction that is perpendicular to the first direction; forming a gate line extending in the first direction to intersect the active area; forming a hard mask pattern on the semiconductor substrate that has an opening that exposes the active area at one side of the gate line, wherein the hard mask pattern covers a portion of the active area adjacent to the first sidewall of the active area, while at least a portion of the second sidewall of the active area and a portion of the device isolation pattern adjacent thereto are exposed by the opening in the hard mask pattern; etching the exposed active area to form a recess region using the hard mask pattern as etch mask; and forming an epitaxial pattern in the recess region, the epitaxial pattern including a different constituent semiconductor element than the semiconductor substrate.

In some embodiments, in plan view, the opening is an oblong-shaped opening that extends in the first direction.

In other embodiments, a first portion of the second sidewall of the active area that is adjacent to the gate line is exposed by the opening, while a second portion of the second sidewall of the active area that is adjacent to the first sidewall of the active area is covered by the hard mask pattern.

In further embodiments, in plan view, the opening is a cross-shaped opening.

In still further embodiments, the area of the exposed active area is wider than the area of the active area covered by the hard mask pattern.

In still further embodiments, the hard mask pattern with the opening is formed by forming a hard mask layer and then patterning the hard mask layer.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 5A to 8A are plan views illustrating a method for fabricating the semiconductor device of FIGS. 1 and 2A through 2C;

FIGS. 5B to 8B are sectional views taken respectively along lines I-I' of FIGS. 5A to 8A that further illustrate the method for fabricating the semiconductor device of FIGS. 1 and 2A through 2C;

FIGS. 5C to 8C are sectional views taken respectively along lines II-II' of FIGS. 5A to 8A that further illustrate the method for fabricating the semiconductor device of FIGS. 1 and 2A through 2C;

DETAILED DESCRIPTION OF THE EMBODIMENTS

Figure 1:
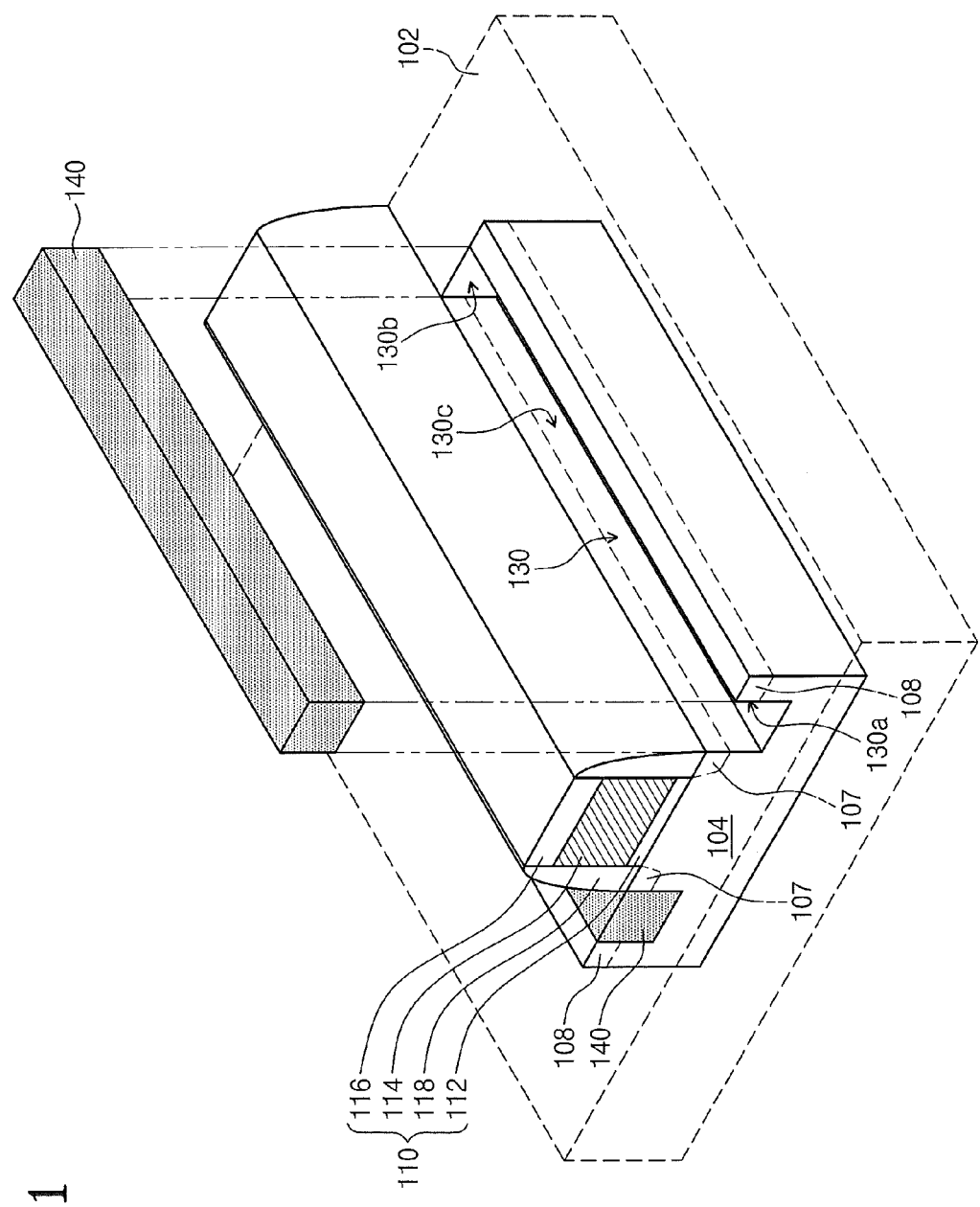
FIG. 1 is a perspective view of a semiconductor device according to an exemplary embodiment of the inventive concept.

Preferred embodiments of the inventive concept will be described below in more detail with reference to the accompanying drawings. Advantages and features of the inventive concept will be clarified through the following embodiments described with reference to the accompanying drawings. The inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art.

It will be understood that when a layer (or film) is referred to as being "on" another layer or substrate, it can be directly on the other layer or substrate, or one or more intervening layers may also be present. It will also be understood that when a layer is referred to as being "under" another layer, it can be directly under the other layer, or one or more intervening layers may also be present. It will also be understood that when a layer is referred to as being "between" two layers, it can be the only layer between the two layers, or one or more intervening layers may also be present. In the drawings, the dimensions of layers (or films) and regions may be exaggerated for clarity of illustration. Although terms such as first, second, and third are used to describe various regions and layers (or films) in various embodiments of the inventive concept, the regions and layers are not limited by these terms. These terms are used only to discriminate one region or layer from another region or layer. Therefore, a layer referred to as a first layer in one embodiment may be referred to as a second layer in another embodiment. An embodiment described and exemplified herein includes a complementary embodiment thereof. As used herein, the term "and/or" includes at least one of the associated listed items. Throughout the specification, like reference numerals refer to like elements.

Exemplary embodiments of the inventive concept will now be described in detail with reference to the accompanying drawings.

Figure 2A:
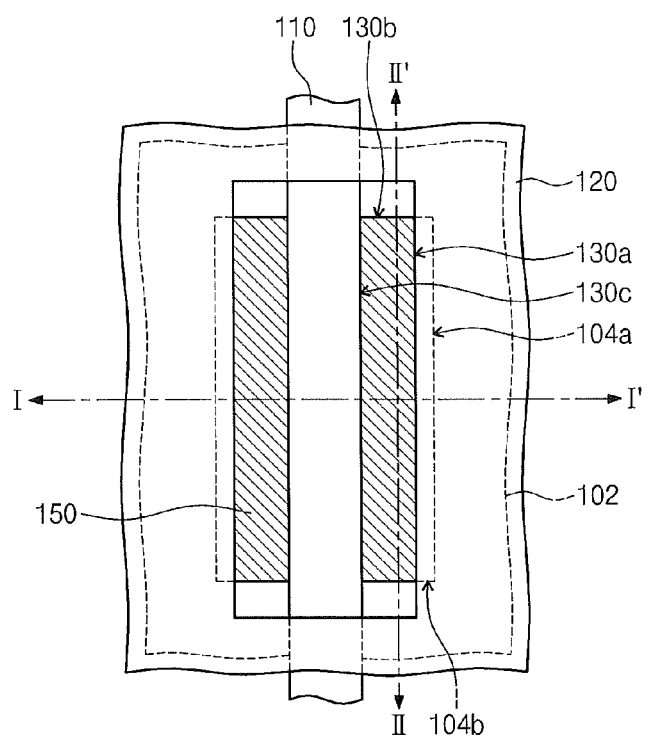
FIG. 2A is a plan view of a semiconductor device of FIG. 1.
Figure 2B:
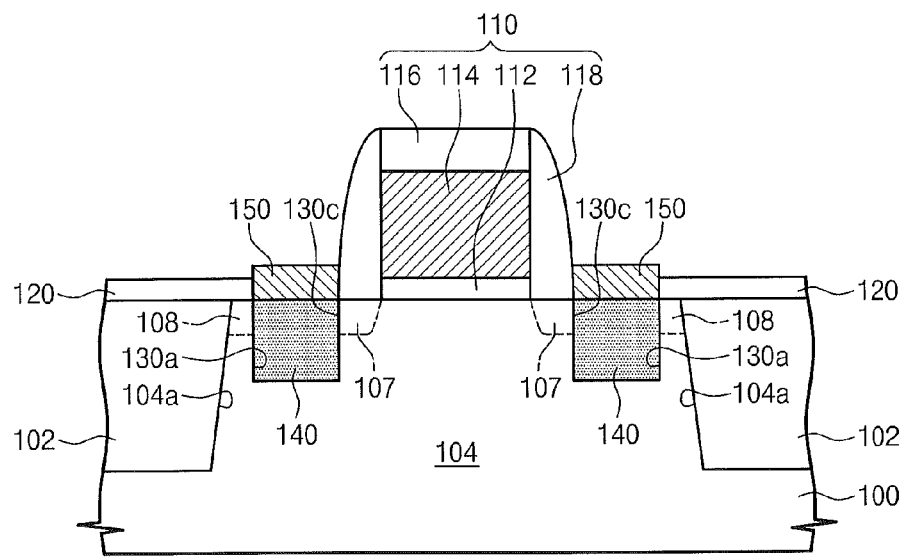
FIGS. 2B and 2C are sectional views of the semiconductor device of FIGS. 1 and 2A, which are taken respectively along lines I-I' and II-II' of FIG. 2A.
Figure 2C:
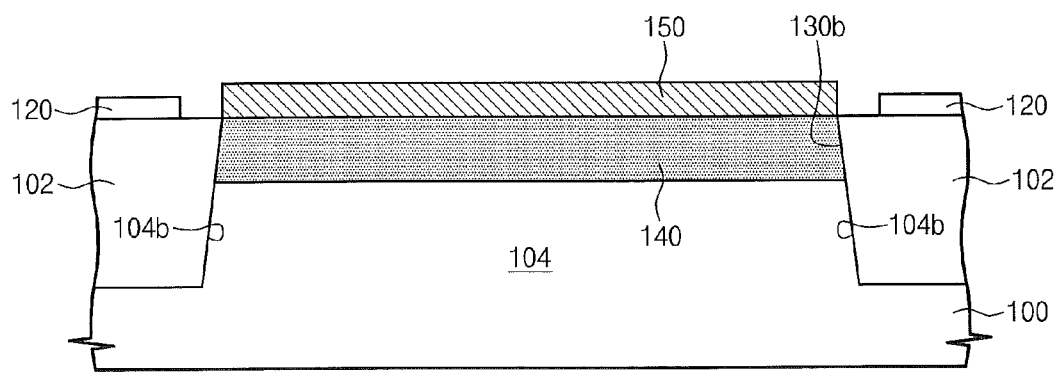

Hereinafter, a description will be given of a semiconductor device according to an exemplary embodiment of the inventive concept with reference to FIGS. 1 and 2A through 2C. FIG. 1 is a perspective view of the semiconductor device, and FIG. 2A is a plan view of the semiconductor device. FIGS. 2B and 2C are sectional views of the semiconductor device of FIGS. 1 and 2A which are taken, respectively, along lines I-I' and II-II' of FIG. 2A.

Referring to FIGS. 1 and 2A to 2C, a device isolation pattern 102 may be formed or otherwise disposed in a semiconductor substrate 100 to define an active area 104. The active area 104 may correspond to the portion of the semiconductor substrate 100 that is surrounded by the device isolation pattern 102. The active area 104 may include a first sidewall 104a that extends in a first direction and a second sidewall 104b that extends in a second direction. The first direction and the second direction may be perpendicular to each other. As shown in FIG. 2A, the length of the first sidewall 104a may be greater than the length of the second sidewall 104b. The active area 104 may be doped with a first-type dopant. For example, a well region doped with a first-type dopant may be disposed in the semiconductor substrate 100. The device isolation pattern 102 may be disposed in the well region, and the active area 104 may be doped with the first-type dopant.

The semiconductor substrate 100 may be monocrystalline. In some embodiments, the semiconductor substrate 100 may be a silicon substrate. However, the inventive concept is not limited thereto. According to another exemplary embodiment, the semiconductor substrate 100 may be a germanium substrate. The device isolation pattern 102 may be a trench-type device isolation pattern. In this case, the device isolation pattern 102 may be formed by forming a trench in the semiconductor substrate 100 and filling the trench with a dielectric material.

A gate line 110 may be disposed across the active area 104. The gate line 110 may extend in the first direction on the active area 104. The gate line 110 may include a gate insulating layer 112 on the active area 104, a gate electrode 114 on the gate insulating layer 112, a capping pattern 116 on the gate electrode 114, and spacers 118 that are disposed on respective sides of the gate insulating layer 112, gate electrode 114 and gate capping pattern 116.

The gate insulating layer 112 may include oxide (e.g., thermal oxide), nitride, oxynitride, and/or high-dielectric material (e.g., a metal oxide such as aluminum oxide and hafnium oxide). The gate electrode 114 may include doped semiconductor (e.g., doped silicon and doped germanium), metal (e.g., tungsten, titanium, and tantalum), conductive metal nitride (e.g., titanium nitride and tantalum nitride), and/or metal-semiconductor compound (e.g., tungsten silicide and cobalt silicide). The capping pattern 116 may include oxide, nitride, and/or oxynitride. The spacer 118 may include oxide, nitride, and/or oxynitride.

Recess regions 130 may be disposed in the active area 104 at both sides of the gate line 110. Each recess region 130 may include a first inner sidewall 130a, a second inner sidewall 130b, and a third inner sidewall 130c. The first inner sidewall 130a and the third inner sidewall 130c may extend in the first direction, and the second inner sidewall 130b may extend in the second direction. The first inner sidewall 130a may be adjacent to the device isolation pattern 102, and the third inner sidewall 130c may be adjacent to the gate line 110. The third inner sidewall 130c may be self-aligned with the outer sidewall of the spacer 118.

The active area 104 may form the first inner sidewall 130a and the third inner sidewall 130c of the recess region 130, and the device isolation pattern 102 may form the entire second inner sidewall 130b of the recess region 130. An undoped region of the active area 104 may form the bottom surface of the recess region 130.

A first lightly-doped region 107 under the spacer 118 may form at least a portion of the third inner sidewall 130c of the recess region 130. A second lightly-doped region 108 under a hard mask pattern 120 may form at least a portion of the first inner sidewall 130a of the recess region 130. The first and second lightly-doped regions 107 and 108 may be regions doped with a second-type dopant.

An epitaxial pattern 140 may be disposed in each recess region 130. Each epitaxial pattern 140 may completely fill its respective recess region 130. The epitaxial pattern 140 may contact the first inner sidewall 130a, the second inner sidewall 130b and the third inner sidewall 130c of the recess region 130. The top surface of the epitaxial pattern 140 may be higher than or equal in height to the top surface of the active area 104. The portion of the active area 104 adjacent to the first inner sidewall 130a of the recess region 130 may be disposed between the device isolation pattern 102 and the sidewall of the epitaxial pattern 140 that extends in the first direction.

The sidewall of the epitaxial pattern 140 that extends in the first direction may contact the second lightly-doped region 108. The sidewall of the epitaxial pattern 140 that extends in the second direction may contact the device isolation pattern 102.

The epitaxial pattern 140 may include a different constituent semiconductor element than the semiconductor substrate 100. Herein, the term "constituent semiconductor element" refers to a semiconductor element that forms the lattice structure of the semiconductor layer or pattern. Thus, a dopant material that is used to alter the electrical properties of a semiconductor layer or pattern is not a constituent semiconductor element, nor are other intentionally or unintentionally added impurities. When the epitaxial pattern 140 is formed to include a different constituent semiconductor element than the semiconductor substrate 100, it may provide a compressive force or a tensile force to the channel region that is defined in the active area 104 under the gate line 110. Accordingly, the mobility of carriers in the channel generated in the channel region may increase when the field effect transistor operates. This will be described below in detail.

If the field effect transistor is a PMOS transistor, the epitaxial pattern 140 may provide a compressive force to the channel region thereof. The mobility of carriers in the channel region may increase when a compressive force is provided to the channel region. In order to provide a compressive force to the channel region, the epitaxial pattern 140 may include a semiconductor element that has a larger diameter than the semiconductor element of the semiconductor substrate 100. For example, if the semiconductor substrate 100 is a silicon substrate, the epitaxial pattern 140 may include silicon-germanium or germanium. Accordingly, the epitaxial pattern 140 may provide a compressive force to the channel region.

If the field effect transistor is an NMOS transistor, the epitaxial pattern 140 may provide a tensile force to the channel region. The mobility of carriers in the channel region may increase when a tensile force is provided to the channel region. In order to provide a tensile force to the channel region, the epitaxial pattern 140 may include a semiconductor element that has a smaller diameter than the semiconductor element of the semiconductor substrate 100. For example, if the semiconductor substrate 100 is a silicon substrate, the epitaxial pattern 140 may include silicon carbide (SIC). Accordingly, the epitaxial pattern 140 may provide a tensile force to the channel region.

According to an exemplary embodiment, the entire epitaxial pattern 140 may be doped with a second-type dopant. The epitaxial pattern 140 may correspond to a source/drain of a field effect transistor. One of the first-type and second-type dopants is an n-type dopant and the other is a p-type dopant. If the field effect transistor is a PMOS transistor, the first-type dopant may be an n-type dopant and the second-type dopant may be a p-type dopant. If the field effect transistor is an NMOS transistor, the first-type dopant may be a p-type dopant and the second-type dopant may be an n-type dopant.

The first lightly-doped region 107 contacts the epitaxial pattern 140. The dopant concentration in the first lightly-doped region 107 may be lower than the dopant concentration in the epitaxial pattern 140. An LDD-type source/drain may be implemented by the first lightly-doped region 107 and the epitaxial pattern 140.

The hard mask pattern 120 may be disposed on the device isolation pattern 102. The hard mask pattern 120 may extend laterally to cover a portion of the active area 104 that is between the first inner sidewall 130a of the recess region 130 and the portion of the device isolation pattern 102 that is adjacent to the first inner sidewall 130a. The hard mask pattern 120 may cover the second lightly-doped region 108. As shown in FIGS. 2A and 2C, the hard mask pattern 120 may not cover the device isolation pattern 102 adjacent to the second inner sidewall 130b. The hard mask pattern 120 may be formed of oxide, nitride, and/or oxynitride.

A capping semiconductor pattern 150 may be disposed on the epitaxial pattern 140. The capping semiconductor pattern 150 may be formed of the same semiconductor element as the semiconductor substrate 100. For example, if the semiconductor substrate 100 is a silicon substrate, the capping semiconductor pattern 150 may be formed of silicon. The capping semiconductor pattern 150 may contact the top surface of the epitaxial pattern 140. The capping semiconductor pattern 150 may be monocrystalline. Although not illustrated in the drawings, metal silicide may be disposed on the capping semiconductor pattern 150. The metal silicide may be formed by the reaction between a metal that is disposed on the capping semiconductor pattern 150 and the semiconductor element in the capping semiconductor pattern 150.

In the above embodiment, an undoped portion of the active area 104 forms the bottom surface of the recess region 130, and the second lightly-doped region 108 forms the first inner sidewall 130a of the recess region 130. In a modified embodiment, a doped portion of the active area 104 may form the bottom surface of the recess region 130. This embodiment will be described below with reference to FIG. 3. In this modified embodiment, like reference numerals are used to denote like elements that are identical to the elements of the semiconductor device that are described above with reference to FIGS. 1 and 2A to 2C.

Figure 3:
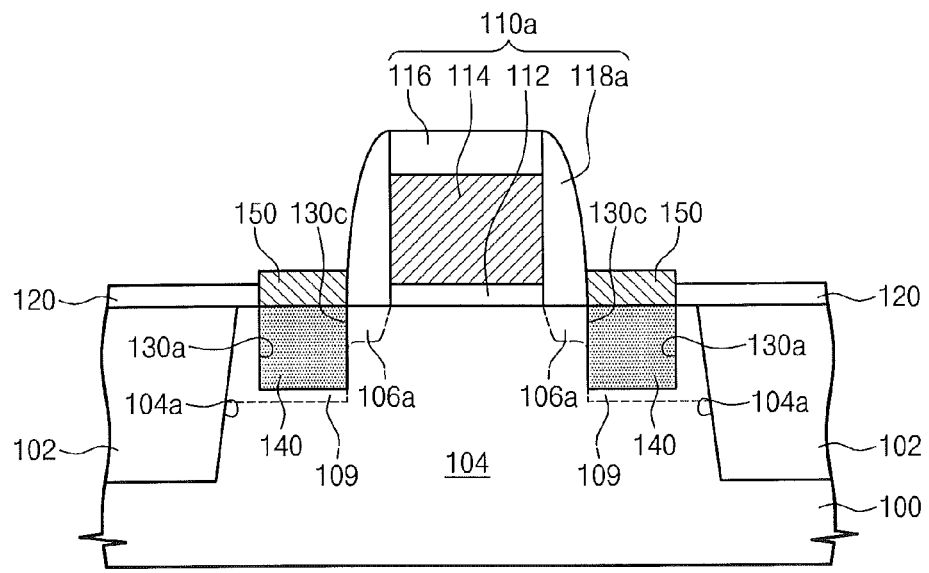
FIG. 3 is a sectional view of an exemplary modification to the semiconductor device of FIGS. 1 and 2A-2C.

FIG. 3 is a sectional view of an exemplary modification of the semiconductor device of FIGS. 1 and 2A-2C, which is taken along line I-I' of FIG. 2A.

Referring to FIG. 3, a gate line 110a extends in a first direction over an active area 104. The gate line 110a may include a gate insulating layer 112, a gate electrode 114, a capping pattern 116, and a spacer 118a. A lightly-doped region 106a may be disposed in a portion of the active area 104 that is under the spacer 118a. The semiconductor substrate 100 is doped with a first-type dopant, and the lightly-doped region 106a is doped with a second-type dopant. A heavily-doped region 109 may be disposed in the active area 104 and the epitaxial pattern 140 may be located at one side of the spacer 118a. The heavily-doped region 109 may form the first inner sidewall 130a and the bottom surface of the recess region 130. The heavily-doped region 109 may be doped with a second-type dopant. The lightly-doped and heavily-doped regions 107 and 109 may constitute a source/drain.

In the above embodiments, the recess regions have a tetragonal section. In yet another modified embodiment, the recess regions may be formed to have a polygonal section. This will be described below with reference to FIG. 4. In this modified embodiment, like reference numerals are used to denote like elements identical to those of the semiconductor device described with reference to FIGS. 1 and 2A to 2C.

Figure 4:
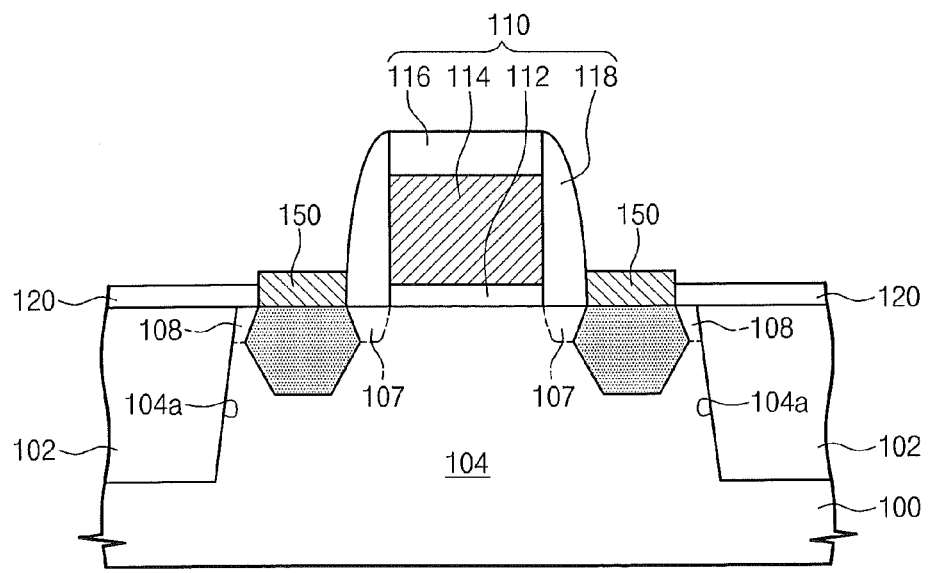
FIG. 4 is a sectional view of another exemplary modification of a semiconductor device of FIGS. 1 and 2A-2C.

FIG. 4 is a sectional view illustrating another exemplary modification of the semiconductor device of FIGS. 1 and 2A through 2C, which is taken along line I-I' of FIG. 2A.

Referring to FIG. 4, a recess region is disposed in the active area 104 at both sides of a gate line 110 and is filled with an epitaxial pattern 141. This recess region may be formed to have a polygonal (more than tetragonal) cross-section. The recess region may have 3 or more inner surfaces. The inner surfaces of the recess region may be the same crystal faces. For example, the inner surfaces of the recess region may be {111} crystal faces.

Hereinafter, a description will be given of a method for fabricating a semiconductor device of FIGS. 1 and 2A-2C. In particular, FIGS. 5A to 8A, 5B to 8B and 5C to 8C are views illustrating a method for fabricating the semiconductor device of FIGS. 1 and 2A-2C. FIGS. 5A to 8A are plan views, while FIGS. 5B to 8B are sectional views taken respectively along lines I-I' of FIGS. 5A to 8A and FIGS. 5C to 8C are sectional views taken respectively along lines II-II' of FIGS. 5A to 8A.

Figure 5A:
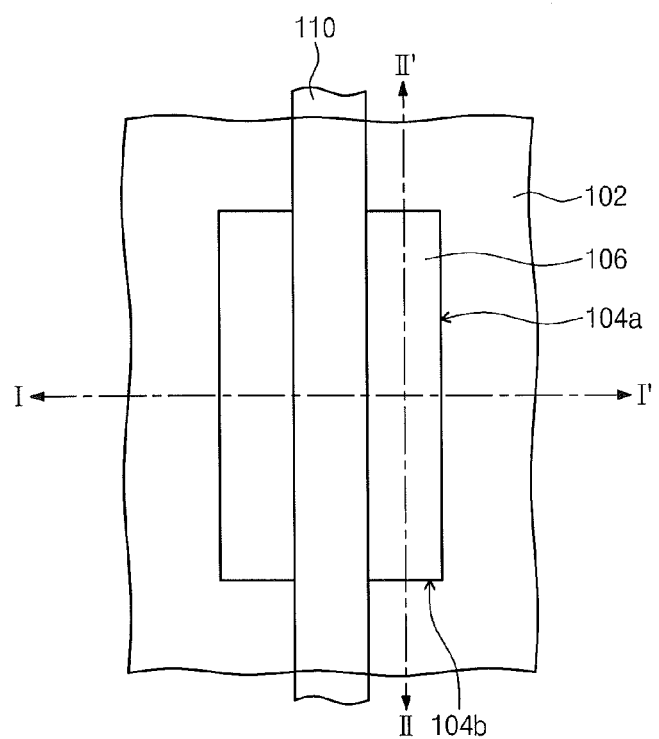
Figure 5B:
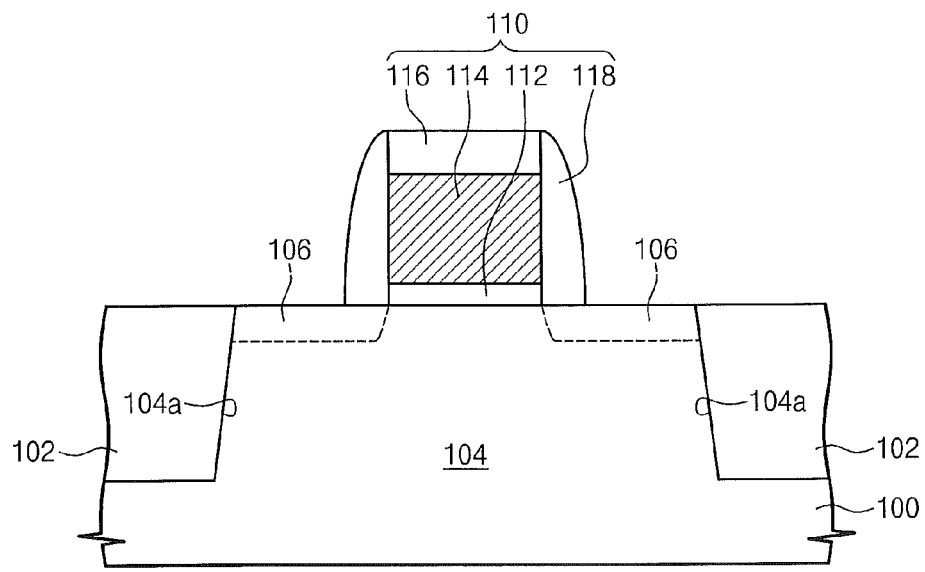
Figure 5C:
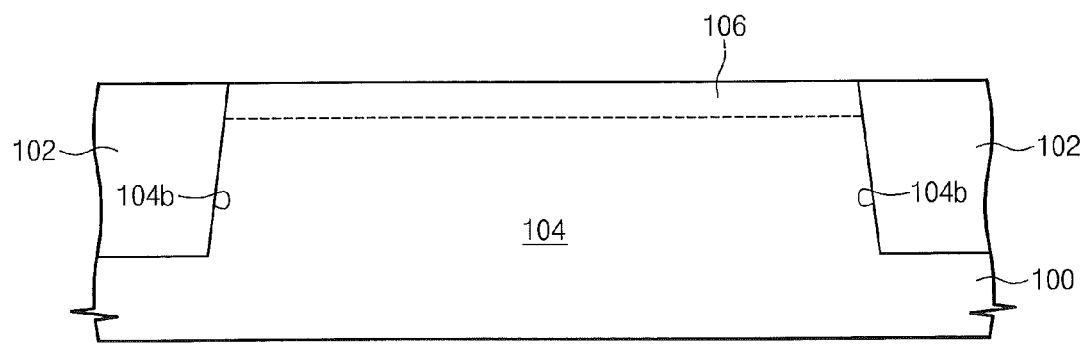

Referring to FIGS. 5A to 5C, a device isolation pattern 102 is formed in a semiconductor substrate 100 to define an active area 104. The active area 104 may be doped with a first-type dopant. The active area 104 may include a first sidewall 104a that extends in a first direction and a second sidewall 104b that extends in a second direction that is perpendicular to the first direction. As shown in FIG. 5A, the length of the first sidewall 104a may be greater than the length of the second sidewall 104b. The device isolation pattern 102 may be a trench-type device isolation pattern. The device isolation pattern 102 may be formed of oxide, nitride, and/or oxynitride.

A gate insulating layer 112, a gate electrode 114, and a capping pattern 116 may be sequentially formed on the semiconductor substrate 100. The gate patterns 112, 114 and 116 may be used as an ion implantation mask to implant second-type dopant ions into the active area 104 to form a lightly-doped region 106. A spacer 118 may be formed on both sidewalls of the gate patterns 112, 114 and 116. The spacer 118 may be formed by forming a spacer layer on the semiconductor substrate 100 with the gate patterns 112, 114 and 116 and then etching the spacer layer anisotropically. The spacer layer may include an oxide layer, a nitride layer, and/or an oxynitride layer. Accordingly, a gate line 110 including the gate insulating layer 112, the gate electrode 114, the capping pattern 116, and the spacer 118 may be formed. The gate line 110 may extend in the first direction.

Figure 6A:
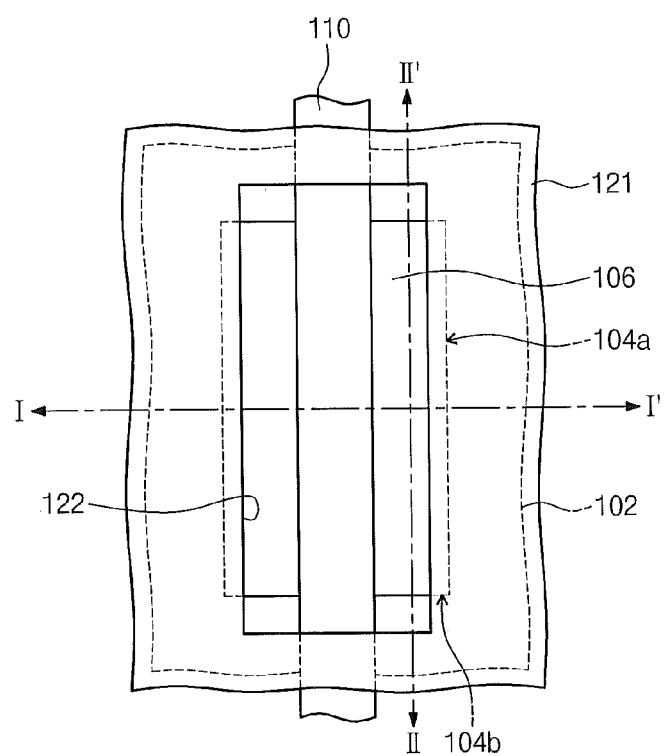
Figure 6B:
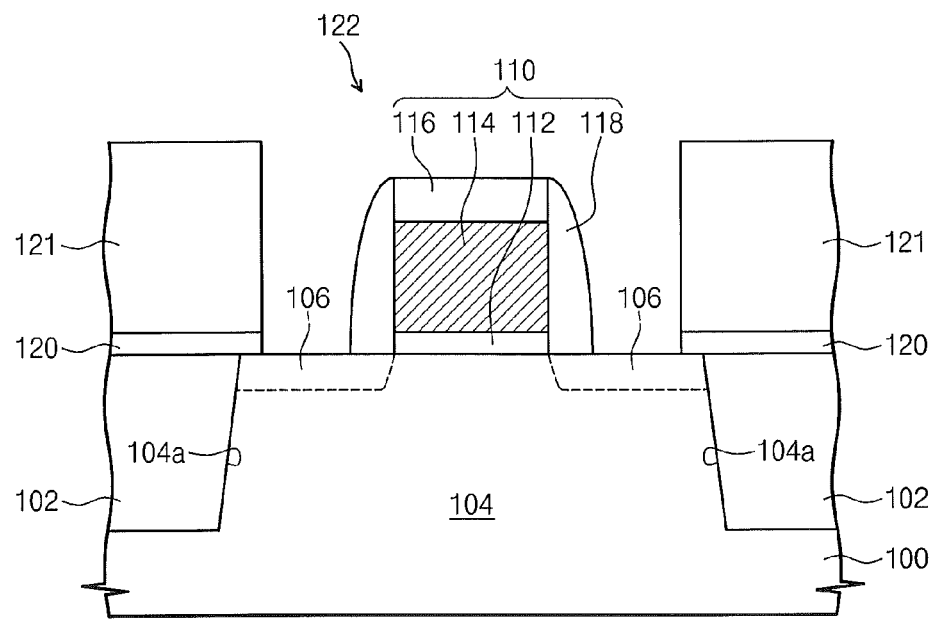
Figure 6C:
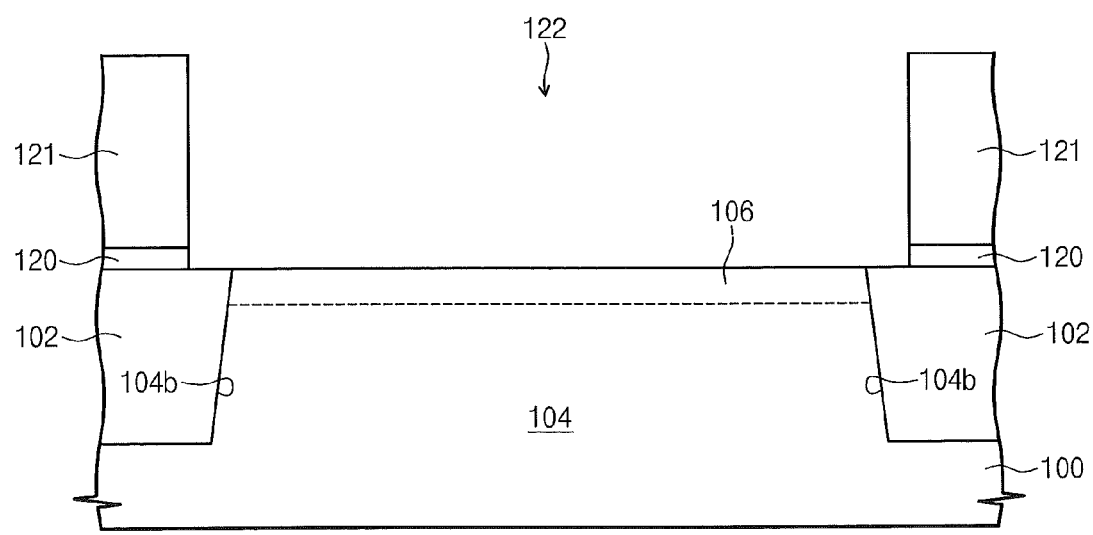

Referring to FIGS. 6A to 6C, a hard mask pattern 120 may be formed on the device isolation pattern 102, and a photoresist pattern 121 may be formed on the hard mask pattern 120. The hard mask pattern 120 and the photoresist pattern 121 may include an opening 122 that exposes the active area 104 at both sides of the gate line 110. The hard mask pattern 120 may define a lower portion of the opening 122, and the photoresist pattern 121 may define an upper portion of the opening 122. The hard mask pattern 120 and the photoresist pattern 121 may cover a portion of the active area 104 adjacent to the first sidewall 104a of the active area 104. The hard mask pattern 120 and the photoresist pattern 121 may also cover the device isolation pattern 102 adjacent to the first sidewall 104a of the active area 104. The hard mask pattern 120 may be formed by forming a hard mask layer on the semiconductor substrate 100 including the gate line 110 and patterning the hard mask layer by using the photoresist pattern 121 as an etch mask. The hard mask layer may be formed of oxide, nitride, and/or oxynitride.

As shown in FIGS. 6A and 6C, the opening 122 may expose at least a portion of the second sidewall 104b of the active area 104. The opening 122 may also expose portions of the active area that are adjacent to each side of the gate line 110. The opening 122 may expose portions of the device isolation pattern 102 that are adjacent to the second sidewall 104b of the active area 104. The opening 122 may expose the gate line 110. The opening 122 may be an oblong opening that extends in the first direction. The area of the exposed active area 104 may be wider than the area of the active area 104 covered with the hard mask pattern 120.

Figure 7A:
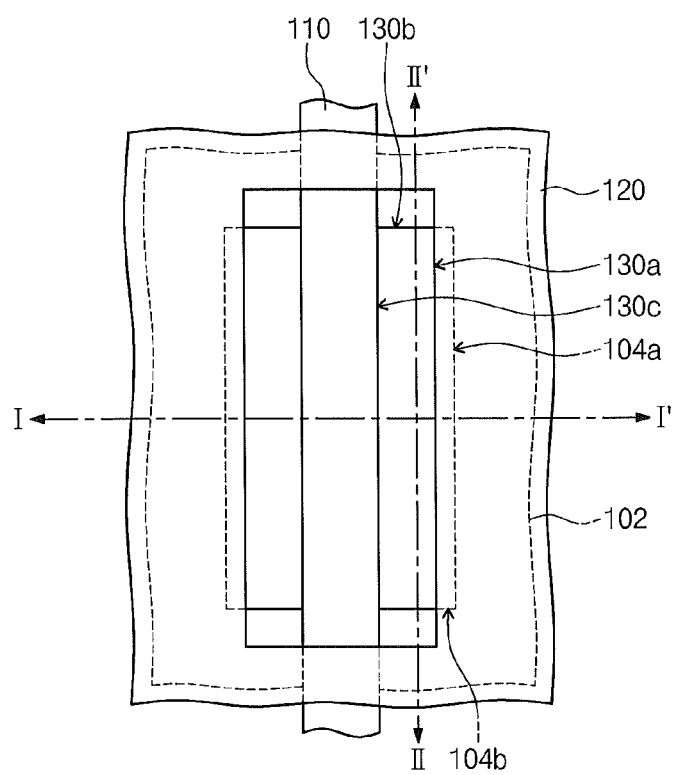
Figure 7B:
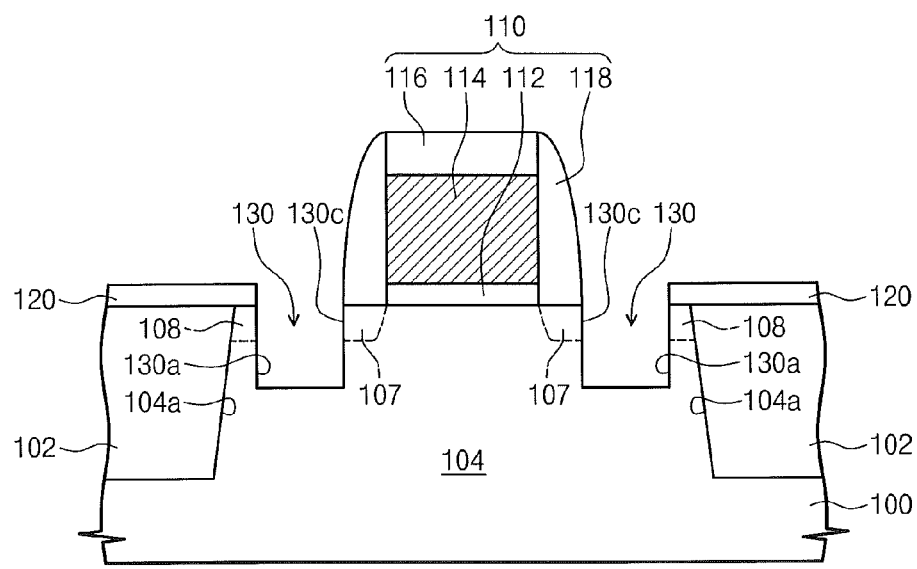
Figure 7C:
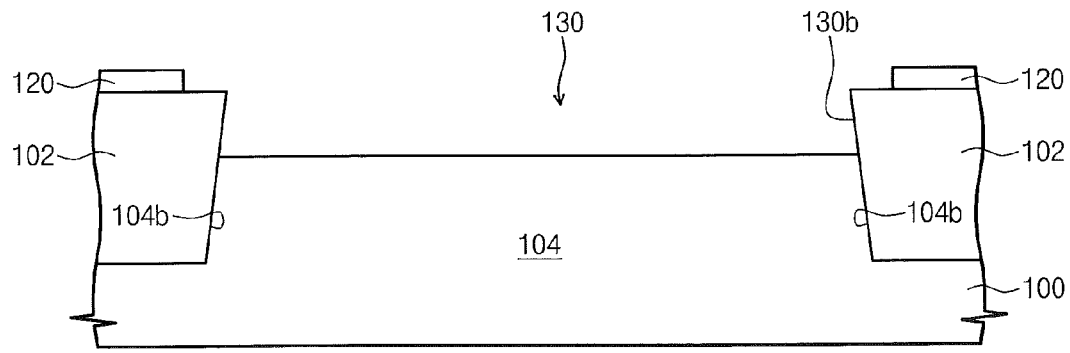

Referring to FIGS. 7A to 7C, the photoresist pattern 121 may be removed, and the portions of the active area 104 that are exposed by the opening 122 may be etched. The active area 104 may be etched using the gate line 110 and the hard mask pattern 120 as an etch mask. The active area 104 may be anisotropically or isotropically etched through a wet etching process and/or a dry etching process. The portion of the active area 104 that is exposed by the opening 122 may be etched to form recess regions 130 in the active area 104.

Each recess region 130 may include a first inner sidewall 130a extending in the first direction, a second inner sidewall 130b extending in the second direction, and a third inner sidewall 130c extending in the first direction. The third inner sidewall 130c may be disposed under the spacer 118, and the first inner sidewall 130a may be adjacent to the device isolation pattern 102. The active area 104 may form the first inner sidewall 130a and the third inner sidewall 130c, and the device isolation pattern 102 may form the second inner sidewall 130b). An undoped portion of the active area 104 may form the bottom surface of each recess region 130.

The exposed portion of the active area 104 may be etched to etch a portion of the lightly-doped region 106 that is disposed in the active area 104 at both sides of the gate line 110. As shown in FIG. 7B, a portion of the lightly-doped region 106 may be etched to form a first lightly-doped region 107 under the spacer 118 and a second lightly-doped region 108 under the hard mask pattern 120. The first lightly-doped region 107 and the second lightly-doped region 108 may be portions of the lightly-doped region 106 that remain after the lightly-doped region 106 is etched. The second lightly-doped region 108 may form a portion of the first inner sidewall 130a. The first lightly-doped region 107 may form a portion of the third inner sidewall 130c.

Figure 8A:
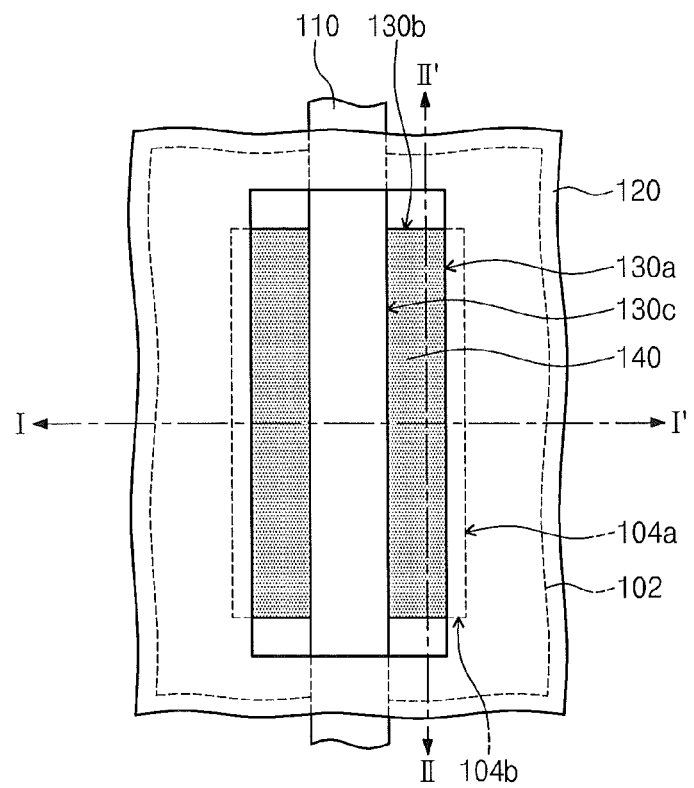
Figure 8B:
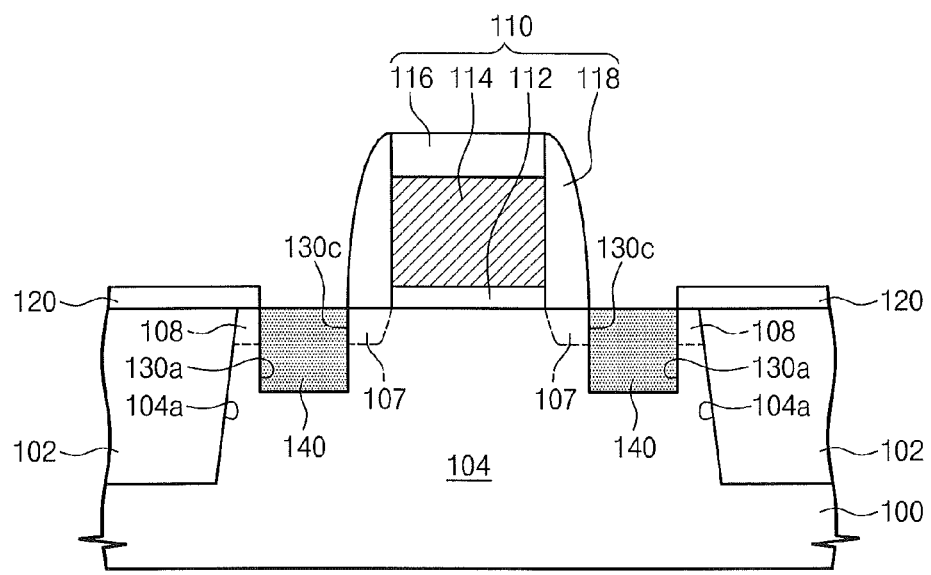
Figure 8C:
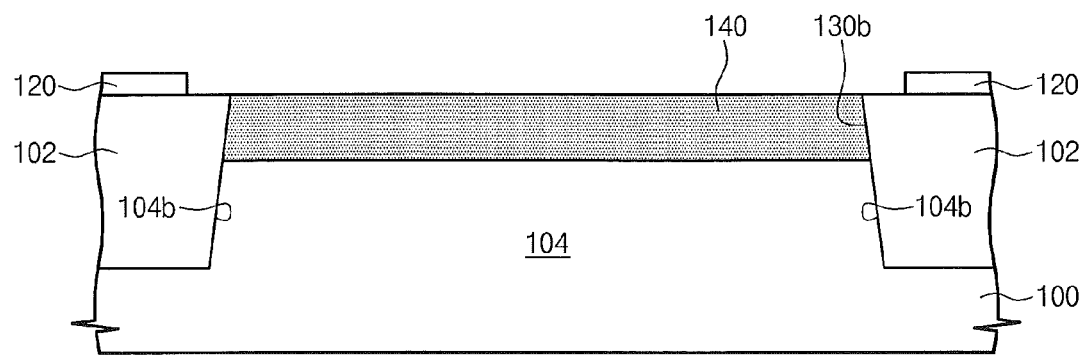

Referring to FIGS. 8A to 8C, a selective epitaxial growth process may be performed on the semiconductor substrate 100 with the recess regions 130 to form epitaxial patterns 140 in the recess regions 130. In some embodiments, the epitaxial patterns 140 may fill their respective recess regions 130. A portion of the active area 104 under the spacer 118, a portion of the active area 104 under the hard mask pattern 120, and a portion of the active area 104 constituting the bottom surface of the recess region 130 may act as a seed layer to form the epitaxial pattern 140 in the selective epitaxial growth process. In this case, the epitaxial pattern 140 may be grown simultaneously from the bottom surface of the recess region 130, the first inner sidewall 130a and the third inner sidewall 130c. As a result, the top surface of the first inner sidewall 130a may be substantially flat. The epitaxial pattern 140 may be formed to extend along both sides of the gate line 110, thereby applying a compressive force or a tensile force to the entire portion of the active area 104 under the gate line 110 adjacent to the device isolation pattern 102.

If the hard mask pattern 120 does not cover a portion of the active area 104 adjacent to the first sidewall 104a, the first inner sidewall 130a of the recess region 130 will be formed of the device isolation pattern 102. In this case, a portion of the active area 104 that comprises the bottom surface of the recess region 130 and a portion of the active area 104 under the spacer 118 may act as a seed layer in the selective epitaxial growth process. In other words, the epitaxial growth occurs at the bottom surface of the recess region 130 and at the third inner sidewall 130c of the recess region 130 under the spacer 118, and epitaxial growth does not occur at the first inner sidewall 130a that is formed of the device isolation pattern 102. In this case, the top surface of the grown epitaxial pattern may not be flat. For example, the height of the top surface of the epitaxial pattern may increase toward the gate line 110. If the top surface of the epitaxial pattern is not flat, the possibility of a contact failure between a contact plug and the epitaxial pattern 140 may be increased. However, as described above, according to embodiments of the inventive concept, the epitaxial pattern 140 can be grown simultaneously from three surfaces of the recess region 130, thus making it possible to implement a higher reliability semiconductor device.

The epitaxial pattern 140 may include a different constituent semiconductor element than the semiconductor substrate 100. The epitaxial pattern 140 may be doped with a second-type dopant. The epitaxial pattern 140 may be doped through an in-situ process. The epitaxial pattern 140 may have a higher dopant concentration than the first and second lightly-doped regions 107 and 108. The epitaxial pattern 140 may completely fill the recess region 130. The epitaxial pattern 140 may contact the first inner sidewall 130a and the second inner sidewall 130b of the recess region 130.

A portion of the active area 104 that is covered with the hard mask pattern 120 is disposed between the device isolation pattern 102 and the first inner sidewall 130a of the epitaxial pattern 140 that extends in the first direction. The portion of the active area 104 covered with the hard mask pattern 120 may extend between the epitaxial pattern 140 and the device isolation pattern 102. The second inner sidewall 130b of the epitaxial pattern 140 that extends in the second direction may contact the device isolation pattern 102.

A capping semiconductor pattern 150 (see FIGS. 2A to 2C) may be formed on the epitaxial pattern 140. The capping semiconductor pattern 150 may be formed through a selective epitaxial growth process. Accordingly, a semiconductor device according to an exemplary embodiment of the inventive concept can be implemented.

Hereinafter, a method for fabricating an example of a modified version of the semiconductor device of FIGS. 1 and 2A through 2C will be described with reference to FIGS. 9 and 10.

Figure 9:
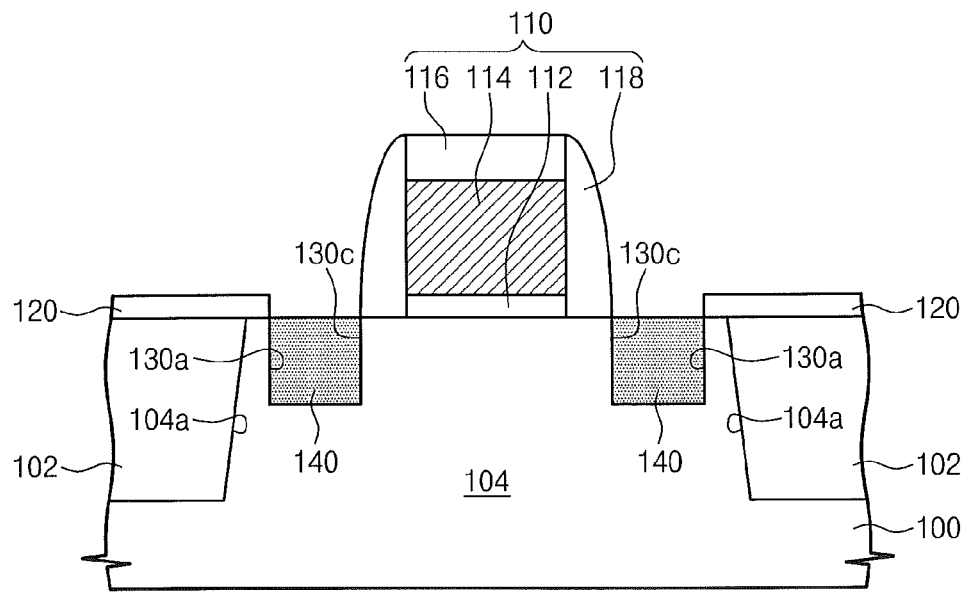
FIGS. 9 and 10 are sectional views illustrating a method for fabricating an example of a modified version of the semiconductor device of FIGS. 1 and 2A through 2C.
Figure 10:
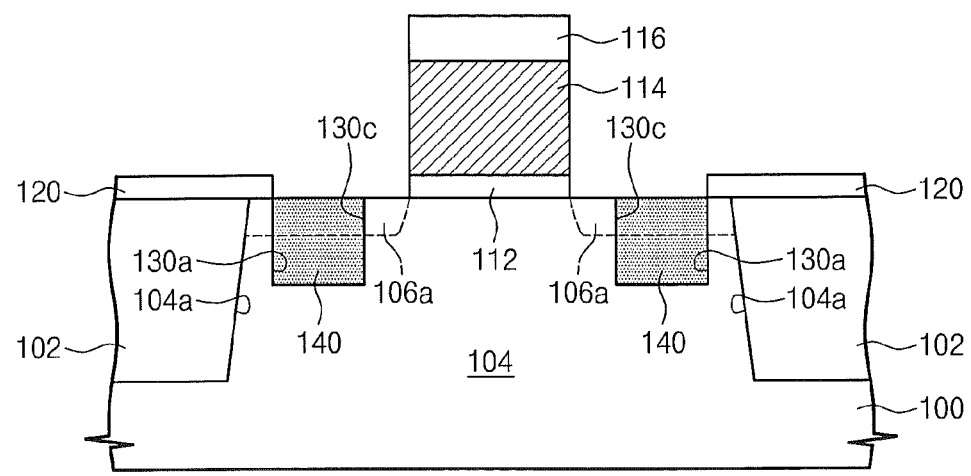

FIGS. 9 and 10 are sectional views illustrating a method for fabricating the example of a modified version of the semiconductor device of FIGS. 1 and 2A through 2C. The method for fabricating the semiconductor device of FIGS. 9 and 10 may correspond to the processes described with reference to FIGS. 5A to 8A, 5B to 8B and 5C to 8C, except the process of forming the lightly-doped region 106 may be modified in the manner discussed below.

Referring to FIG. 9, a selective epitaxial growth process may be performed to form an epitaxial pattern 140 that fills the recess region 130. According to this modified embodiment, the epitaxial pattern 140 may be an undoped epitaxial pattern.

Referring to FIG. 10, the spacer 118 may then be removed. The gate patterns 112, 114 and 116 may be used as an ion implantation mask to implant second-type dopant ions into the active area 104 and the epitaxial pattern 140 to form a lightly-doped region 106a. The lightly-doped region 106a may be formed at an upper portion of the active area 104 and an upper portion of the epitaxial pattern 140.

Referring to FIG. 3, a second spacer 118a may be formed on both sidewalls of the gate patterns 112, 114 and 116. The second spacer 118a may be formed by forming a second spacer layer on the semiconductor substrate 100 and etching the second spacer layer anisotropically. The gate line 110 may be used as an ion implantation mask to implant second-type dopant ions into the active area 104 and the epitaxial pattern 140 to form the heavily-doped region 109. The heavily-doped region 109 may have a higher dopant concentration than the lightly-doped region 106a. The lightly-doped and heavily-doped regions 106a and 109 may together constitute a source/drain region.

According to this modified embodiment, after the epitaxial pattern 140 is formed in the recess region 130, the spacer 118 may be removed, the lightly-doped region 106a may be formed, the second spacer 118a may be formed, and the heavily-doped region 109 may then be formed.

Hereinafter, a method for fabricating yet another exemplary modification of a semiconductor device according to an exemplary embodiment of the inventive concept will be described with reference to FIG. 4. A method for fabricating the semiconductor device according to this modified embodiment may include the processes described with reference to FIGS. 5A to 8A, 5B to 8B and 5C to 8C. However, the process of forming the recess regions may be different.

Referring to FIG. 4, a first anisotropic etching process, an isotropic etching process, a second anisotropic etching process, and a selective wet etching process may be sequentially performed to etch the exposed active area 104. The selective wet etching process uses selected crystal faces among the crystal faces of the semiconductor substrate 100 as an etch stop face. The selective wet etching process may use {111} crystal faces of the semiconductor substrate 100 as an etch stop face. In other words, the etching rate of the {111} crystal faces by the selective wet etching process may be lower than the etching rate of the other crystal faces by the selective wet etching process. Accordingly, by the selective wet etching process, the inner surfaces of the recess region may have {111} crystal faces.

Hereinafter, a description will be given of a semiconductor device according to another exemplary embodiment of the inventive concept.

Figure 11:
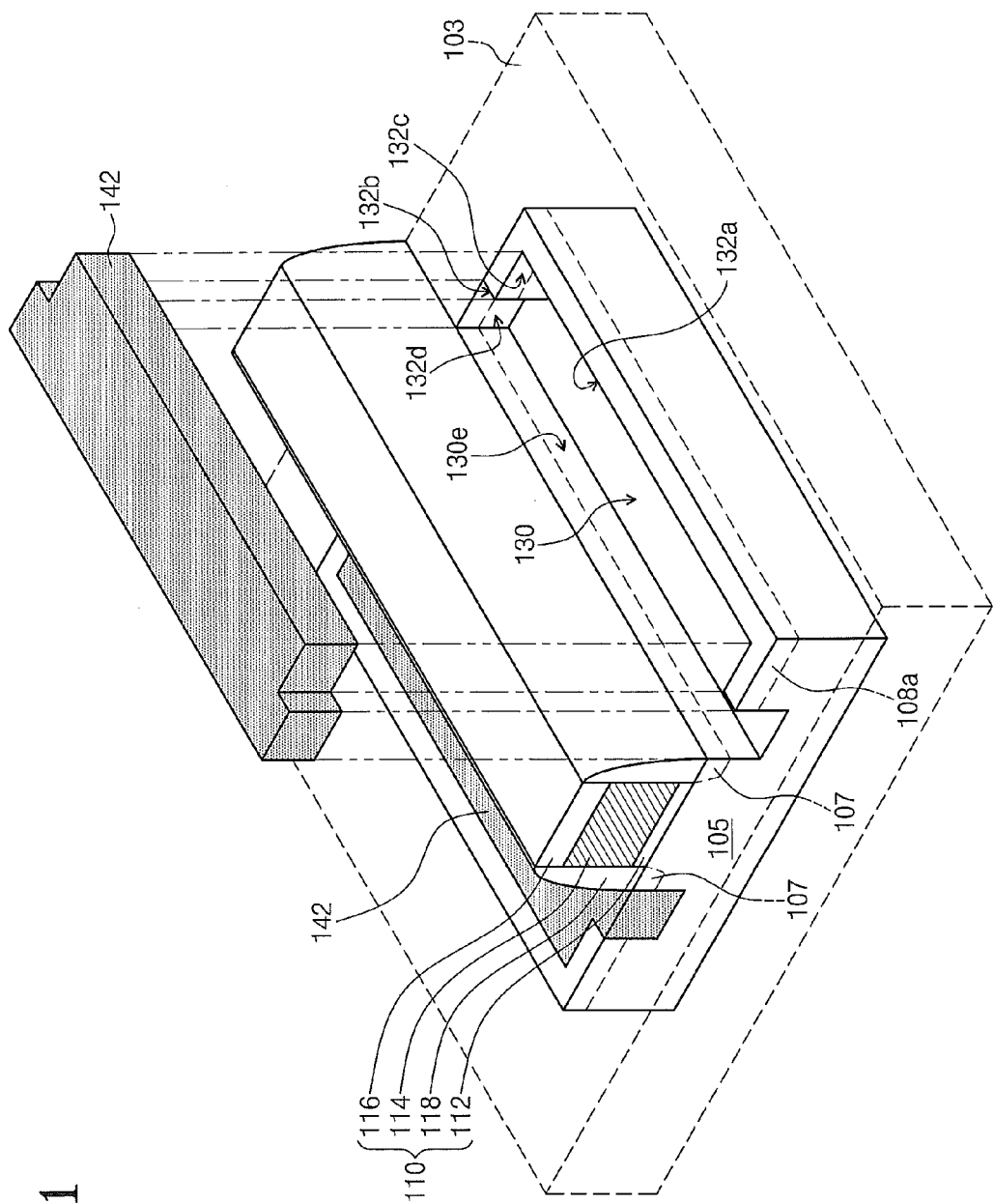
FIG. 11 is a perspective view of a semiconductor device according to another exemplary embodiment of the inventive concept.
Figure 12A:
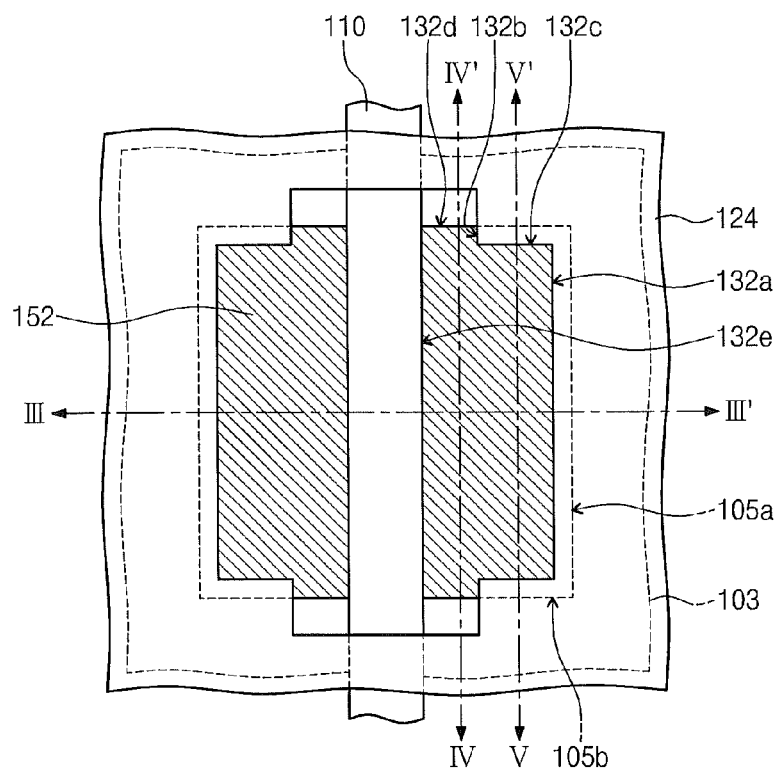
FIG. 12A is a plan view of the semiconductor device of FIG. 11.
Figure 12B:
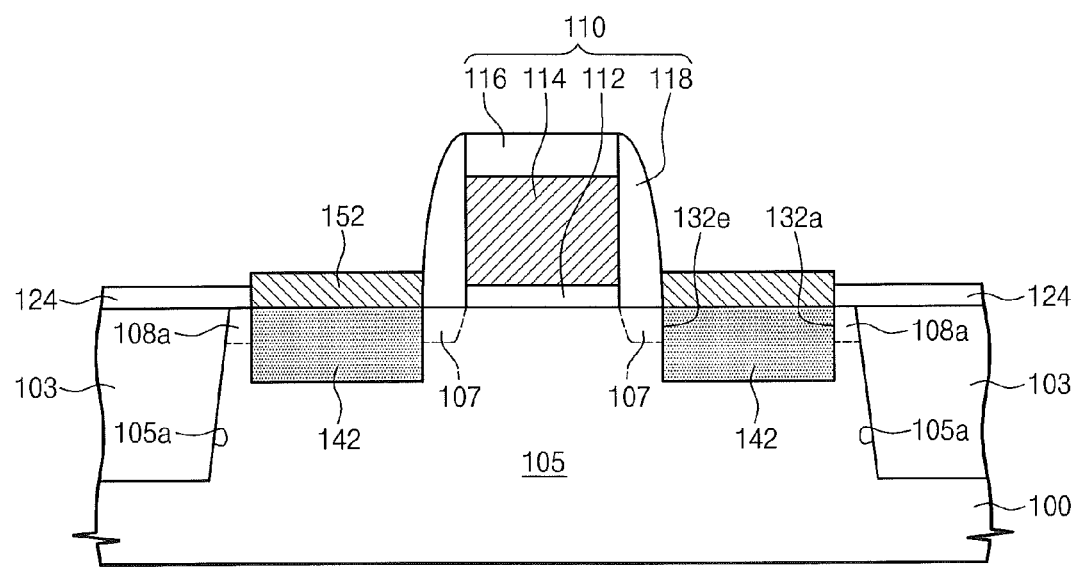
FIGS. 12B to 12D are sectional views of the semiconductor device of FIGS. 11 an 12A, which are taken respectively along lines III-III', IV-IV' and V-V' of FIG. 12A.
Figure 12C:
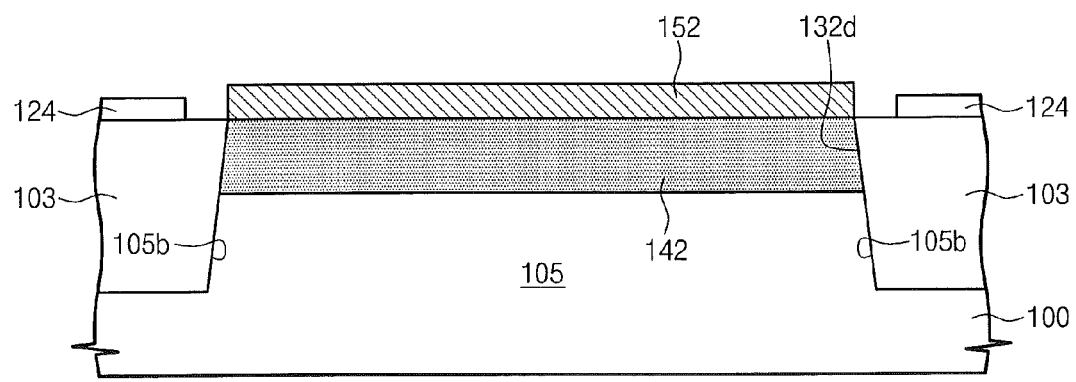
Figure 12D:
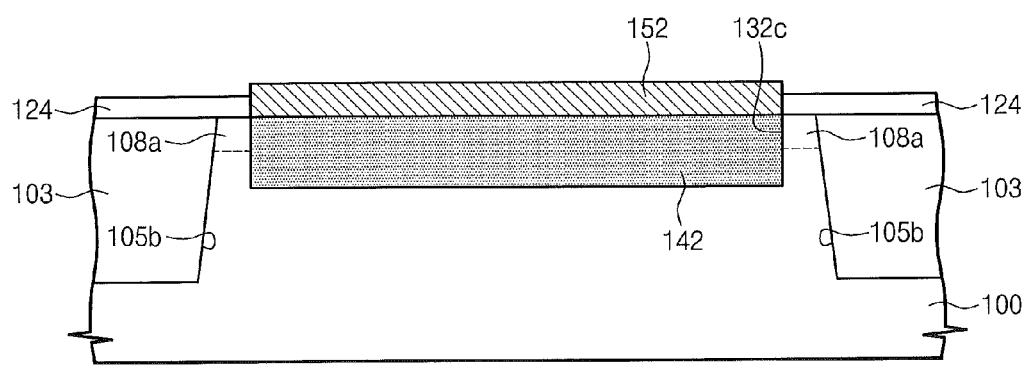

FIG. 11 is a perspective view of a semiconductor device according to another exemplary embodiment of the inventive concept. FIG. 12A is a plan view of a semiconductor device of FIG. 11. FIGS. 12B to 12D are sectional views of the semiconductor device of FIG. 12A, which are taken respectively along lines III-III', IV-IV' and V-V' of FIG. 12A.

Referring to FIGS. 11 and 12A to 12D, a device isolation pattern 103 may be formed that defines an active area 105 in a semiconductor substrate 100. The active area 105 may include a first sidewall 105a that extends in a first direction and a second sidewall 105b that extends in a second direction that is perpendicular to the first direction. The device isolation pattern 103 may be formed by forming a trench in the semiconductor substrate 100 and filling the trench with a dielectric material. A gate line 110 that extends in the first direction may be disposed to intersect the active area 105.

A recess region 132 may be disposed in the active area 105 at both sides of the gate line 110. The recess region 132 may include a first inner sidewall 132a/132b, a second inner sidewall 132c/132d, and a third inner sidewall 132e. The first inner sidewall 132a/132b and the third inner sidewall 132e may extend in the first direction, and the second inner sidewall 132c/132d may extend in the second direction.

The first inner sidewall 132a/132b may include a first portion 132a and a second portion 132b. The first portion 132a of the first inner sidewall may be adjacent to the first sidewall 105a of the active area 105. The second portion 132b of the first inner sidewall may be disposed between the gate line 110 and a virtual straight line that travels along the first portion 132a of the first inner sidewall and extends in the first direction. The third inner sidewall 132e may be disposed below the spacer 118 adjacent to the gate line 110. The second portion 132b of the first inner sidewall may be adjacent to the second sidewall 105b of the active area 105, and may be disposed between the third inner sidewall 132e and the portion of the active area 105 adjacent to the first sidewall 105a of the active area 105.

The length of the third inner sidewall 132e in the first direction may be equal to the length of the first portion 132a of the first inner sidewall and the second portion 132b of the first inner sidewall in the first direction. The active area 105 may form the both the portions 132a and 132b of the first inner sidewall and the third inner sidewall 132e. A first lightly-doped region 107 that is disposed under the spacer 118 may form a portion of the third inner sidewall 132e. The first lightly-doped region 107 may be a region doped with a second-type dopant. A second lightly-doped region 108a adjacent to the device isolation pattern 103 may form at least part of the first/second portions 132a/132b of the first inner sidewall. The second lightly-doped region 108a may be a region doped with a second-type dopant.

The second inner sidewall 132c/132d may include a first portion 132c and a second portion 132c. The first portion 132c of the second inner sidewall may be adjacent to the first sidewall 105a of the active area 105, and the second portion 132d of the second inner sidewall may be adjacent to the gate line 110. The second portion 132d of the second inner sidewall may be spaced apart in the first direction from a virtual straight line that passes through the first portion 132c of the second inner sidewall and extends in the second direction to intersect the gate line 110.

The second portion 132d of the second inner sidewall may be disposed between the third inner sidewall 132e and the portion of the active area 105 adjacent to the first portion 132c of the second inner sidewall. In the direction perpendicular to the gate line 110, the length of the first portion 132c of the second inner sidewall may be greater than the length of the second portion 132d of the second inner sidewall. The active area 105 may form the first portion 132c of the second inner sidewall, and the device isolation pattern may form the second portion 132d of the second inner sidewall. The second lightly-doped region 108a may form a portion of the first portion 132c of the second inner sidewall. An undoped portion of the active area 105 may form the bottom surface of the recess region 132.

An epitaxial pattern 142 may be disposed in the recess region 132. The epitaxial pattern 142 may completely fill the recess region 132. The epitaxial pattern 142 may contact the first and second portions 132a and 132b of the first inner sidewall of the recess region 132, the first and second portions 132c and 132d of the second inner sidewall, and the third inner sidewall 132e. The width in the second direction of the portion of the epitaxial pattern 142 that is disposed between the third inner sidewall 132e and the second portion 132b of the first inner sidewall of the recess region 132 may be smaller the width in the second direction of the portion of the epitaxial pattern 142 that is disposed between the third inner sidewall 132e and the first portion 132a of the first inner sidewall.

The portion of the active area 105 adjacent to the first and second portions 132a and 132b of the first inner sidewall of the recess region 132 may be disposed between the device isolation pattern 103 and the sidewall of the epitaxial pattern 142 that extends in the first direction. A portion of the sidewall of the epitaxial pattern 142 that extends in the second direction may contact the device isolation pattern 103, and the other portion may contact the portion of the active area 105 adjacent to the first portion 132c of the second inner sidewall. The top surface of the epitaxial pattern 142 may be higher than or equal in height to the top surface of the active area 105.

The epitaxial pattern 142 may include the same material as the above-described epitaxial pattern 140.

A hard mask pattern 124 may be disposed on the device isolation pattern 103. The hard mask pattern 124 may extend laterally to cover the portion of the active area 105 between the first portion 132a of the first inner sidewall of the recess region 132 and the device isolation pattern 103 adjacent to the first portion 132a of the first inner sidewall, and the portion of the active area 105 between the first portion 132c of the second inner sidewall and the device isolation pattern 103 adjacent to the first portion 132c of the second inner sidewall. The hard mask pattern 124 may be formed of oxide, nitride, and/or oxynitride.

A capping semiconductor pattern 152 may be disposed on the epitaxial pattern 142. The capping semiconductor pattern 152 may include the same material as the above-described capping semiconductor pattern 150.

Hereinafter, a description will be given of a method for fabricating a semiconductor device according to another exemplary embodiment of the inventive concept.

Figure 13A:
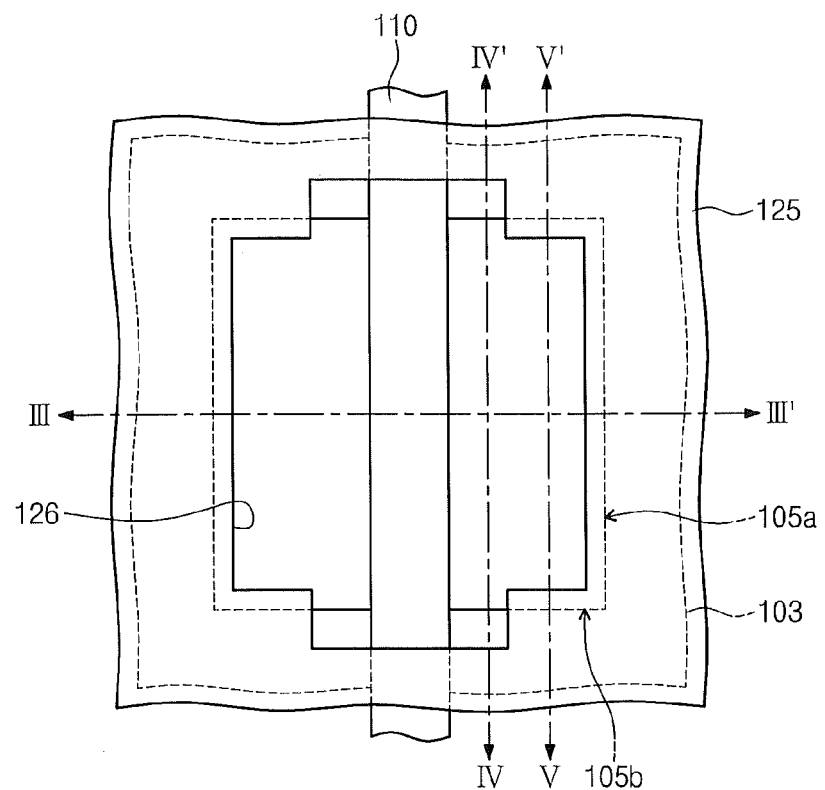
FIGS. 13A and 14A are plan views illustrating a method for fabricating the semiconductor device of FIGS. 11 and 12A through 12D.
Figure 13B:
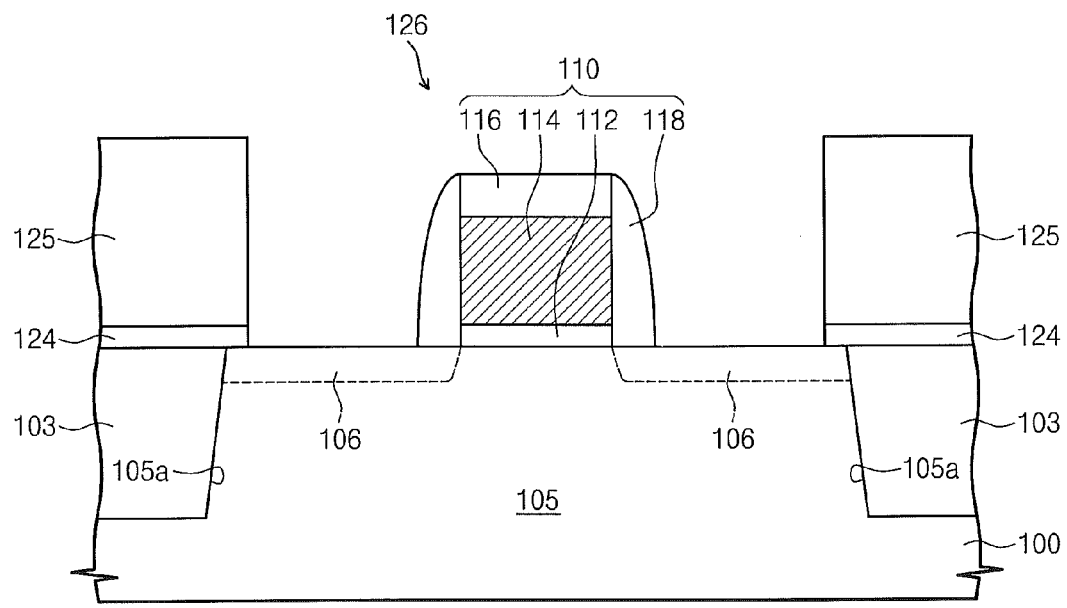
FIGS. 13B and 14B are sectional views which are taken respectively along lines III-III' of FIGS. 13A and 14A.
Figure 13C:
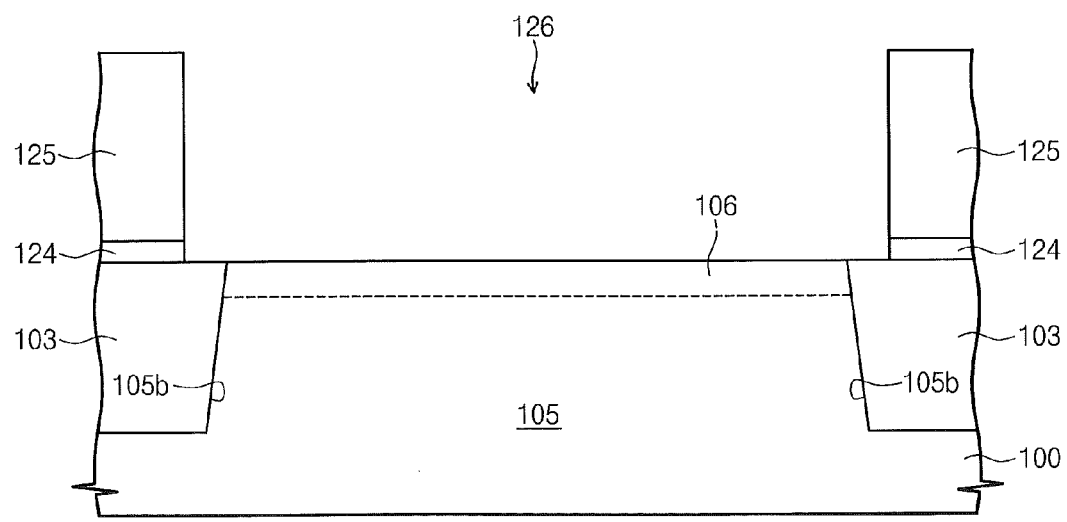
FIGS. 13C and 14C are sectional views which are taken respectively along lines IV-IV' of FIGS. 13A and 14A.
Figure 13D:
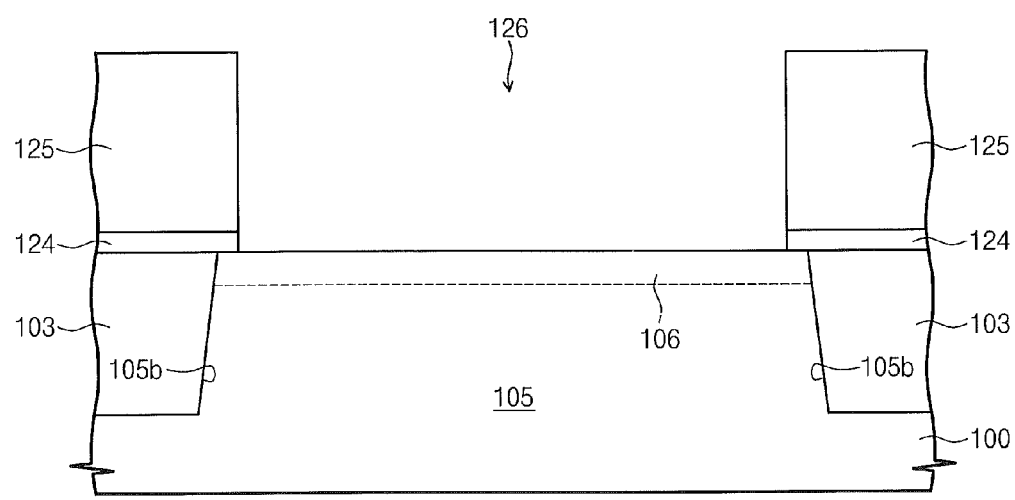
FIGS. 13D and 14D are sectional views which are taken respectively along lines V-V' of FIGS. 13A and 14A.
Figure 14A:
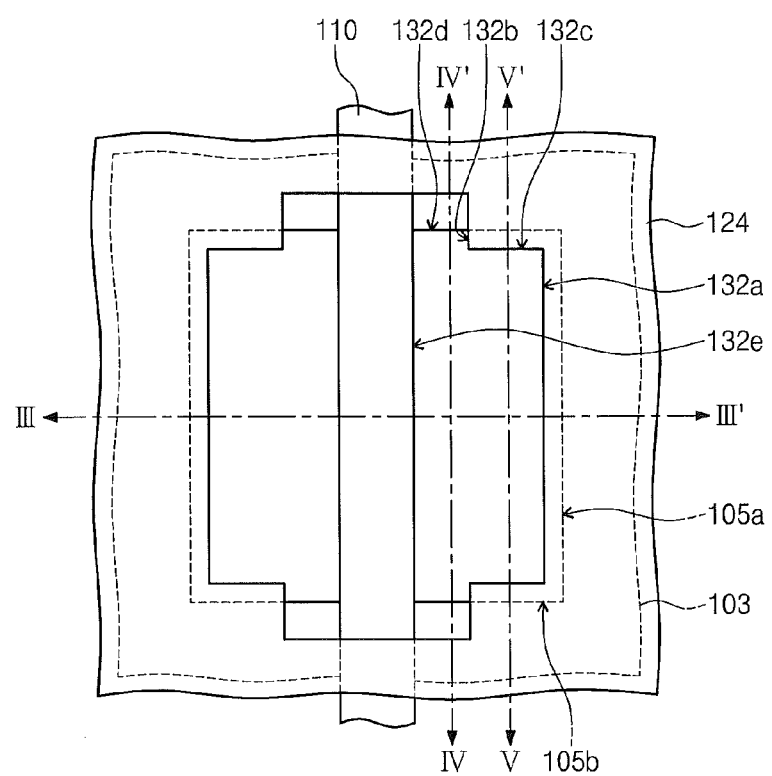
Figure 14B:
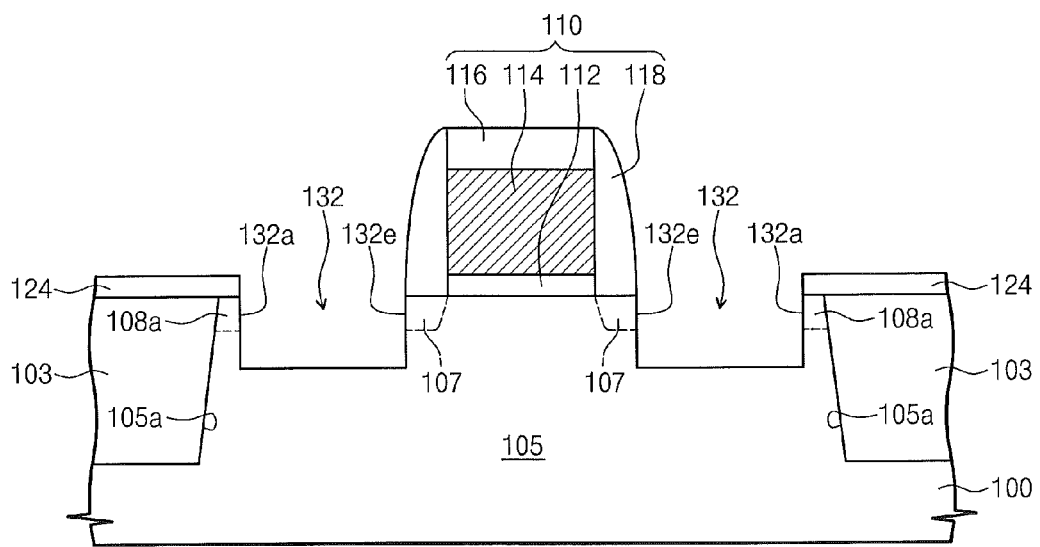
Figure 14C:
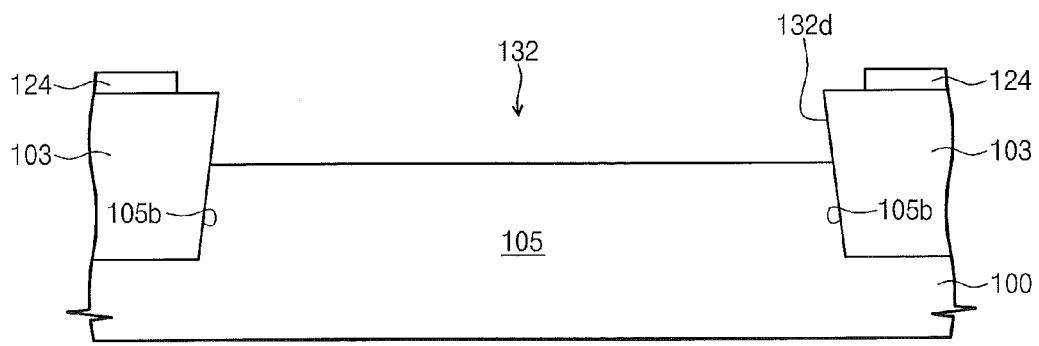
Figure 14D:
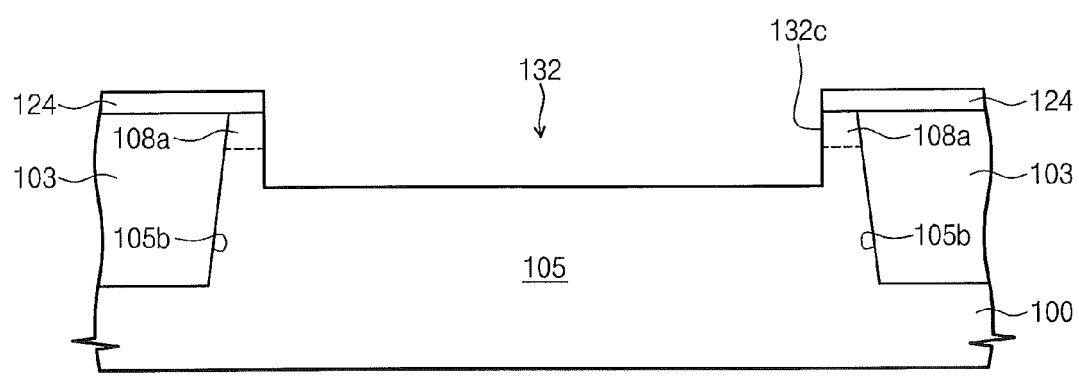

FIGS. 13A through 13D and 14A through 14D illustrate a method for fabricating the semiconductor device of FIGS. 11 and 12A-12D. In particular, FIGS. 13A and 14A are plan views illustrating a method for fabricating the semiconductor device of FIGS. 11 and 12A-12D. FIGS. 13B and 14B are sectional views taken respectively along lines of FIGS. 13A and 14A. FIGS. 13C and 14C are sectional views taken respectively along lines IV-IV' of FIGS. 13A and 14A. FIGS. 13D and 14D are sectional views taken respectively along lines V-V' of FIGS. 13A and 14A.

Referring to FIGS. 13A to 13D, a device isolation pattern 103 is formed in a semiconductor substrate 100 to define an active area 105. The active area 105 may include a first sidewall 105a extending in a first direction and a second sidewall 105b extending in a second direction that is perpendicular to the first direction. In some embodiments, the extending length of the first sidewall 105a may be equal to the extending length of the second sidewall 105b. A gate line 110 and a lightly-doped region 106 may be formed on the semiconductor substrate 100 in the same way as described above with reference to FIGS. 5A to 5C.

A hard mask pattern 124 and a photoresist pattern 125 may be formed on the device isolation pattern 103. The hard mask pattern 124 and the photoresist pattern 125 may include an opening 126 that exposes the gate line 110 and the portion of the active area 105 at both sides of the gate line 110. The hard mask pattern 124 may define a lower region of the opening 126, and the photoresist pattern 125 may define an upper region of the opening 126. The hard mask pattern 124 and the photoresist pattern 125 may cover a portion of the active area 105 adjacent to the first sidewall 105a of the active area 105.

As shown in FIG. 13A, the portion of the second sidewall 105b of active area 105 that is adjacent to the gate line 110 may be exposed by the opening 126, while the portion of the second sidewall 105b of active area 105 that is adjacent to the first sidewall 105a of the active area 105 may be covered by the hard mask pattern 124. The portion of the device isolation pattern 103 that is adjacent to the portion of the second sidewall 105b may be exposed by the opening 126. In plan view, the opening 126 may be cross-shaped. The portion of the active area 105 that is exposed by the opening 126 may be wider than the portion of the active area 105 that is covered with the hard mask pattern 124 and the photoresist pattern 125.

Referring to FIGS. 14A to 14D, the photoresist pattern 125 may be removed, and the portion of the active area 105 that is exposed by the opening 126 may be etched. The active area 105 may be etched using the gate line 110 and the hard mask pattern 124 as an etch mask. The active area 105 may be anisotropically or isotropically etched through a wet etching process and/or a dry etching process.

The exposed portion of the active area 105 may be etched to form a recess region 132 in the active area 105. The recess region 132 may include a first inner sidewall 132a/132b, a second inner sidewall 132c/132d, and a third inner sidewall 132e. The first inner sidewall 132a/132b and the third inner sidewall 132e may extend in the first direction, and the second inner sidewall 132c/132d may extend in the second direction.

The first inner sidewall 132a/132b may include a first portion 132a and a second portion 132b. The first portion 132a of the first inner sidewall may be adjacent to the sidewall 105a of the active area 105. The third inner sidewall 132e may be disposed below a spacer 118 and may be adjacent to the gate line 110. The second portion 132b of the first inner sidewall may be adjacent to the second sidewall 105b of the active area 105, and may be disposed between the third inner sidewall 132e and the portion of the active area 105 that is adjacent to the first sidewall 105a of the active area 105.

The active area 105 may form both the portions 132a and 132b of the first inner sidewall and the third inner sidewall 132e. A first lightly-doped region 107 that is disposed under the spacer 118 may form a portion of the third inner sidewall 132e. The second inner sidewall 132c/132d may include a first portion 132c and a second portion 132d. The first portion 132c of the second inner sidewall may be adjacent to the first sidewall 105a of the active area 105, and the second portion 132d of the second inner sidewall may be adjacent to the gate line 110.

The second portion 132d of the second inner sidewall may be disposed between the third inner sidewall 132e and the portion of the active area 105 that is adjacent to the first portion 132c of the second inner sidewall. The active area 105 may form the first portion 132c of the second inner sidewall, and the device isolation pattern 103 may form the second portion 132d of the second inner sidewall. An undoped portion of the active area 105 may form the bottom surface of the recess region 132.

The exposed active area 105 may be etched to remove a portion of the lightly-doped region 106 that is disposed in the active area 105 at both sides of the gate line 110. As a result, a portion of the lightly-doped region 106 may be etched to form a first lightly-doped region 107 under the spacer 118 and a second lightly-doped region 108a under the hard mask pattern 124. The second lightly-doped region 108a may be disposed in the active area 105 adjacent to the first inner sidewall of the active area 105, and may include a first sub region extending in the first direction, and second sub regions extending in the second direction from both ends of the first sub region to the gate line 110. The second sub regions of the second lightly-doped region 108a may not contact the active area 105 under the gate line 110.

Referring to FIGS. 12A to 12D, a selective epitaxial process may be performed on a semiconductor substrate 100 with the recess region 132 to form an epitaxial pattern 142 in the recess region 132. The second epitaxial region 142 may fill the recess region 132. As the active area 105 forms the inner sidewalls 132a, 132b, 132c and 132e of the recess region 132, the inner sidewalls may act as a seed layer for forming the epitaxial pattern 142 during the selective epitaxial growth process. A capping semiconductor pattern 152 may be formed on the epitaxial pattern 142. Accordingly, a semiconductor device according to another exemplary embodiment of the inventive concept can be implemented.

The semiconductor devices according to the above embodiments may be implemented in various types of semiconductor packages. For example, three-dimensional semiconductor memory devices according to exemplary embodiments of the inventive concept may be packaged in various ways such as Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

According to the semiconductor devices described above, the recess region with the inner sidewall formed of the active area is formed in the active area at one side of the gate line so that the top surface of the epitaxial patterns that fill the recess region can be substantially flat. Accordingly, the possibility of a contact failure between a contact plug and the epitaxial pattern can be reduced and/or minimized, thus making it possible to implement high-reliability semiconductor devices.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor device comprising:
   a device isolation pattern disposed in a semiconductor substrate to define an active area;
   a gate line intersecting the active area; and
   an epitaxial pattern that completely fills a recess region in the active area at one side of the gate line, the epitaxial pattern including a different constituent semiconductor element than the semiconductor substrate,
   wherein the recess region includes a first inner sidewall that extends in the lengthwise direction of the gate line, a second inner sidewall that extends in the direction perpendicular to the lengthwise direction of the gate line and a third inner sidewall that is opposite the first inner sidewall and that is between the active area under the gate line and the first inner sidewall,
   wherein the active area comprises the first inner sidewall and the device isolation pattern comprises at least a portion of the second inner sidewall,
   wherein the epitaxial pattern directly contacts the first inner sidewall and the second inner sidewall of the recess region, and
   wherein the first inner sidewall is spaced apart from the device isolation pattern.

2. The semiconductor device of claim 1, wherein the device isolation pattern comprises the entire second inner sidewall.

3. The semiconductor device of claim 1, further comprising a hard mask pattern on the device isolation pattern, wherein the hard mask pattern covers the active area between the first inner sidewall of the recess region and the device isolation pattern adjacent to the first inner sidewall.

4. The semiconductor device of claim 1, wherein the second inner sidewall includes a first portion formed of the active area and a second portion formed of the device isolation pattern, and
   wherein the second portion of the second inner sidewall is closer to the gate line than the first portion of the second inner sidewall.

5. The semiconductor device of claim 4, wherein in the direction perpendicular to the lengthwise direction of the gate line, the length of the first portion of the second inner sidewall is greater than the length of the second portion of the second inner sidewall.

6. The semiconductor device of claim 4, further comprising a hard mask pattern disposed on the device isolation pattern,
   wherein the hard mask pattern covers the active area between the first inner sidewall and the device isolation pattern adjacent to the first inner sidewall and wherein the hard mask pattern further covers the active area between the first portion of the second inner sidewall and the device isolation pattern adjacent to the first portion of the second inner sidewall.

7. The semiconductor device of claim 1, wherein the epitaxial pattern provides a compressive force or a tensile force to the active area under the gate line.

8. The semiconductor device of claim 1, further comprising a capping semiconductor pattern on the epitaxial pattern.

9. The semiconductor device of claim 1, wherein the active area under the gate line is doped with a first-type dopant and the epitaxial pattern is doped with a second-type dopant.

10. The semiconductor device of claim 1, wherein the gate line has a sidewall, and wherein a spacer is on the sidewall of the gate line.

11. The semiconductor device of claim 10, wherein the third inner sidewall of the recess region is aligned with the sidewall of the gate pattern.

12. The semiconductor device of claim 1, wherein a first lightly doped portion of the active region forms at least a portion of the first inner sidewall.

13. The semiconductor device of claim 12, wherein a second lightly doped portion of the active region forms at least a portion of the third inner sidewall.

14. The semiconductor device of claim 13, further comprising a hard mask pattern that is disposed on the device isolation pattern and on a portion of the active area that is between the first inner sidewall of the recess region and the device isolation pattern.

15. The semiconductor device of claim 1, wherein the different constituent semiconductor element that is included in the epitaxial pattern is a semiconductor element that has a larger diameter than a semiconductor element that is a constituent element of the semiconductor substrate, and wherein the semiconductor device is a PMOS transistor.

16. The semiconductor device of claim 1, wherein the different constituent semiconductor element that is included in the epitaxial pattern is a semiconductor element that has a smaller diameter than a semiconductor element that is a constituent element of the semiconductor substrate, and wherein the semiconductor device is an NMOS transistor.

17. The semiconductor device of claim 6, wherein the hard mask pattern directly contacts a capping pattern that is on the epitaxial pattern.

18. The semiconductor device of claim 1, wherein the semiconductor substrate comprises a silicon substrate and wherein the epitaxial pattern comprises a silicon-germanium pattern.

19. The semiconductor device of claim 1, further comprising a capping semiconductor pattern on the epitaxial pattern that is formed of the same constituent semiconductor element as the semiconductor substrate.

* * * * *